(12) United States Patent
Rauenzahn

(10) Patent No.: US 7,826,628 B2
(45) Date of Patent: Nov. 2, 2010

(54) ADDRESSABLE AMPLIFIED SPEAKER ASSEMBLY AND METHOD FOR ADDRESSING THE SAME

(75) Inventor: Richard R. Rauenzahn, Shillington, PA (US)

(73) Assignee: Hubbell Incorporated, Shelton, CT (US)

( * ) Notice: Subject to any disclaimer, the term of this patent is extended or adjusted under 35 U.S.C. 154(b) by 1593 days.

(21) Appl. No.: 11/086,649

(22) Filed: Mar. 23, 2005

(65) Prior Publication Data

US 2006/0215855 A1    Sep. 28, 2006

(51) Int. Cl.
*H03F 99/00*    (2009.01)
*H04B 3/00*    (2006.01)
*H03G 3/00*    (2006.01)
*H03R 27/00*    (2006.01)
*H04M 1/00*    (2006.01)

(52) U.S. Cl. .................. 381/120; 381/77; 381/82; 381/104; 381/107; 379/159

(58) Field of Classification Search ............ 381/120, 381/77–82, 104–107; 379/159
See application file for complete search history.

(56) References Cited

U.S. PATENT DOCUMENTS 1,546,537 A    7/1925    Bornmann
4,847,590 A    7/1989    Gosswiller
5,164,991 A    11/1992    Johnson et al.
5,740,235 A    4/1998    Lester et al.
6,226,370 B1    5/2001    Shih
6,389,139 B1    5/2002    Curtis et al.
6,658,127 B1    12/2003    Kim
2001/0053231 A1    12/2001    Juszkiewicz et al.
2002/0131611 A1    9/2002    Hoover et al.
2003/0035556 A1    2/2003    Curtis et al.
2003/0123680 A1 *    7/2003    Lee et al. .................. 381/104
2003/0142833 A1    7/2003    Roy et al.
2003/0219139 A1    11/2003    Baird et al.
2005/0035851 A1    2/2005    Keeney et al.

FOREIGN PATENT DOCUMENTS

JP    05199576    8/1993

* cited by examiner

*Primary Examiner*—Devona E Faulk
(74) *Attorney, Agent, or Firm*—Paul H. Nguyen-Ba; Mark S. Bicks; Alfred N. Goodman

(57) ABSTRACT

Addressable amplified speakers assembly, and method for addressing the same, suitable for any permanent or temporary public address paging application. Amplified speakers assembly may incorporate VHF and UHF radios to provide wireless, one-way paging from a few feet to many miles away. These speakers can be added to any existing radio system with minimal effort or cost. The need for routing signal cable is eliminated, greatly reducing installation costs. Each speaker can be programmed for individual, group, or all-page access via DTMF or 2-Tone coding (up to 8 different addresses). The volume of each speaker can also be controlled remotely.

16 Claims, 19 Drawing Sheets

ADDRESSABLE AMPLIFIED SPEAKER ASSEMBLY AND METHOD FOR ADDRESSING THE SAME

BACKGROUND OF THE INVENTION

1. Field of the Invention

The present invention is directed in general to amplified speakers of the type where the speaker and the amplifier associated therewith are mounted within the same assembly, and in particular to an amplified speaker assembly and method which allow each amplified speaker assembly to be individually addressed.

2. Discussion of the Background

Amplified speakers are generally employed in situations where a local amplifier is not required, or is not available. For example, amplified speakers are commonly employed in public announcement systems and various telephone applications where use of a local amplifier to drive multiple speakers in remote locations is impractical and virtually impossible. By contrast, non-amplified speakers are often used in home audio systems where, for example, a local amplifier drives a multi-speaker surround-sound audio system.

Conventional amplified speakers are described in, for example, U.S. Pat. No. 5,164,991 to Johnson et al. where an example of a typical amplified speaker includes an electroacoustic speaker having an amplifier section mounted thereon. The amplifier section may be provided as an encapsulated unit or it may simply consist of a printed circuit board with the necessary electronics mounted on and connected to input terminals of the speaker. In those applications where the speaker is mounted in an enclosure, such a disk speakers of the type associated with telephone systems, the amplifier section may be mounted within the speaker enclosure in any convenient manner. With regard to horn speakers and other speakers having a housing or outer casing (which often find application in public announcement systems indoor and/or outdoor), the amplifier section may be mounted within the speaker casing, to provide for weatherproofing of the electronics or to render the speaker explosion-proof.

One of the drawback associated with public announcement systems is lack of individual addressability of the amplified speakers associated with the system. That is, while public announcement systems are well suited for broadcast operation of a message from a single source or multiple amplified speakers, such systems are incapable of broadcasting messages from different sources in different zones of the systems.

Paging systems, of the type typically employed in telephony where each telephone device has an amplified speaker, allow for the capability of sending specific paging signals from one telephone device to another, or to a group of, telephone device(s) (audio paging output device(s)) disposed within a certain zone of the system. U.S. Pat. No. 5,740,235 to Lester et al. discloses a two-way hardwired paging system controller which is accessible from a plurality of input devices, and is user programmable to respond to signaling activity sourced from the input devices to establish a paging connection and perform paging with respect to a selected paging zone served by the system. The paging system controller includes a plurality of input ports, output ports and a bidirectional signal interface unit which provides a page/tone signal path for page/tone signals source from input ports to audio paging output devices of a paging speaker/amplifier subsystem that are coupled to the selected output ports. The signal interface unit also couples talkback tone signals to selected input port connections. The output paging signal functions include transmission of audio tone and voice paging signals via an audio signal path from a paging source to one or more controllably energized paging loudspeakers. One of the drawback of such a system is that it requires a sophisticated central paging system controller to process paging requests and to route such requests to appropriate audio paging output devices. Only those signal sources connected to the input ports of the central paging controller may send paging signals to audio paging output devices (which also must be connected to the central paging controller). Another drawback of such a system, is the hardwired configuration which may be impractical or physically impossible for some system configurations. Yet another drawback of such a system is that it does not provide for remote volume control of audio paging output devices associated therewith.

U.S. Pat. No. 6,226,370 to Shih discloses a telephone pager and intercom system which is connectable to residential DTMF telephone lines, and includes a plurality of pager devices connected to phone lines between the tip and ring wires for each telephone device. Each pager device is individually addressable by means of an identification circuit provided therein. During operation, a person using a telephone keypad may enter a DTMF activation sequence which includes a header, a pager access (pager identification PID which enables a particular pager) and a signal identification (SID which defines which signal is to be produced on the selected pager). An "Intercom Assist" function may be provided in a pager to allow the phone connected through the pager to be put automatically on-hook when intercom usage is detected. "Intercom Assist" allows a local phone line loop to carry DTMF sequences for activating pagers and to carry voice signals for the intercom function to the phone associated with the pager. While the telephone pager system describe in U.S. Pat. No. 6,226,370 to Shih avoids the use of central paging system, this system has very limited capability in that it is confined to telephone devices connected to a single local telephone loop, and (like the system disclosed in U.S. Pat. No. 5,740,235 to Lester et al.) it is hardwired. Also, like the system disclosed in U.S. Pat. No. 5,740,235 to Lester et a., telephone pager and intercom system described in U.S. Pat. No. 6,226,370 to Shih lacks remote volume control capability. Furthermore, Shih does not provide for voice annunciation.

SUMMARY OF THE INVENTION

The present invention provides, inter alia, amplified speakers which allow remote public address paging capability from a portable, mobile, or base radio. Each amplified speaker assembly according to exemplary embodiments of the present invention is individually addressable wirelessly (RF), or by a hardwire (e.g., telephone system), and is suitable for, for example, one-way communication to provide remote one-way paging with either a 600 Ohm page-port or RF input. Each amplified speaker assembly can be remotely programmed for individual, group or all-page access. The volume of each speaker can also be remotely controlled. In addition, the speaker assembly can be made weatherproof.

An exemplary embodiment of an amplified speaker assembly according to the present invention comprises an audio speaker, an amplifier which drives the audio speaker, a volume control circuit which controls sound volume output from the audio speaker, an input configured to receive a signal, and a programmable microprocessor responsive to the signal. The programmable microprocessor commands the volume control circuit to adjust the sound volume output from the audio speaker in accordance with the signal.

Another exemplary embodiment of an amplified speaker assembly according to the present invention comprises an audio speaker, an amplifier which drives said audio speaker, an input configured to receive a signal, and a programmable microprocessor responsive to the signal. The input is configured to receive the signal via a hardwire connection to a source of the signal. The microprocessor activates the amplifier in reply to a detection of a page closure and detection of correct programmed code in the signal received at the input.

Another exemplary embodiment of an amplified speaker assembly according to the present invention comprises an audio speaker, an amplifier which drives said audio speaker, an input configured to receive a signal, and a programmable microprocessor responsive to the signal. The input comprises a receiver configured for wireless reception of the signal. The microprocessor activates the amplifier in reply to a detection of a carrier detect and sub-audible detect, and detection of correct programmed code in the signal received at the input.

Another exemplary embodiment of an amplified speaker assembly according to the present invention provides a method for addressing an amplified speaker assembly comprising an audio speaker, an amplifier which drives the audio speaker, a volume control circuit which controls sound volume output from the audio speaker, an input configured to receive a signal, and a programmable microprocessor responsive to the signal. The method comprises receiving said signal via a hardwire connection to a source of said signal, and adjusting the sound volume output from the audio speaker in accordance with the signal.

Another exemplary embodiment of an amplified speaker assembly according to the present invention provides a method for addressing an amplified speaker assembly comprising an audio speaker, an amplifier which drives the audio speaker, an input configured to receive the signal, and a programmable microprocessor responsive to the signal. The method comprises receiving the signal via a hardwire connection to a source of the signal, and activating the amplifier in reply to a detection of a page closure and detection of correct programmed code in the signal received at the input.

Another exemplary embodiment of an amplified speaker assembly according to the present invention provides a method for addressing an amplified speaker assembly comprising an audio speaker, an amplifier which drives the audio speaker, an input configured to receive a signal, and a programmable microprocessor responsive to the signal. The method comprises receiving the signal via a wireless connection to a source of the signal, and activating said amplifier in reply to a detection of a carrier detect and sub-audible detect, and detection of correct programmed code in the signal received at the input.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE EXAMPLARY EMBODIMENTS OF THE INVENTION

Figure 1:
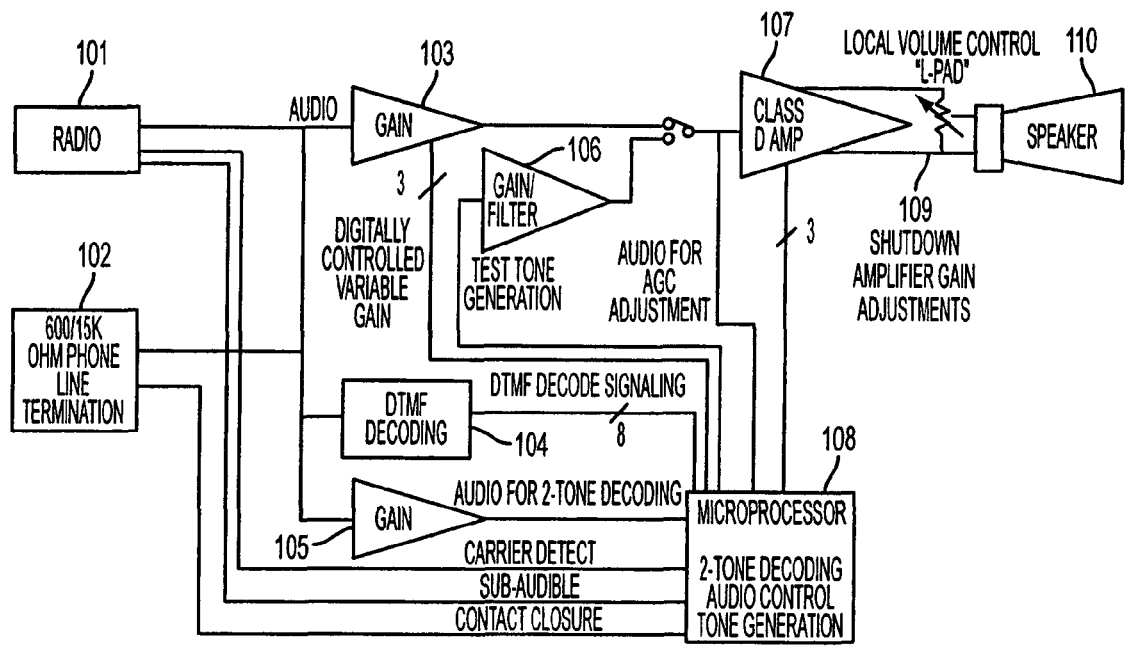
FIG. 1 shows an implementation of an embodiment of the present invention.

Referring now to the drawings, wherein like reference numerals designate identical or corresponding parts throughout the several views, embodiments of the present invention are shown in schematic detail.

An amplified speaker assembly designed for a one-way receive communication, according to an exemplary embodiment of the present invention, is illustrated in FIG. 1.

The amplified speaker assembly of FIG. 1 is capable of providing one-way paging with either a 600-ohm page-port or RF (radio) input.

A default operation mode of the amplified speaker assembly may be set to, for example, a generic broadcast operation. In this operation the amplified speaker assembly receives and broadcasts all received communications.

The amplified speaker assembly is configurable for selective broadcast operation. In this operation the Assembly can be programmed to recognize a plurality (up to, for example, eight) of addresses for user configurable activation coding which can be done by 2-Tone or DTMF coding. These addresses can be used for individual, zone paging or system wide mode, as described in more detail below.

The speaker volume level of each amplified speaker assembly can be controlled locally by an optional local volume control provided at the amplified speaker assembly or remotely by optional DTMF control. Remote volume control of each amplified speaker assembly is described in more detail below.

Throughout this description of exemplary embodiments of the presents invention, the following definitions, acronyms and abbreviations are used:

| | |
|---|---|
| AGC | Automatic Gain Control; adjusts signal level to common output level within a define range of input levels |
| ANI | Automatic Number Identification; allows for differentiation of units which can be translated to location for information or emergency cases |
| CDCSS- | Digital Private Line, Digital coded squelch; allows for multiple user on the same carrier frequency by injecting a continuous stream of digital data that distinguishes one signal from another |
| CTCSS | Private Line, Continuous Tone Coded Squelch System; allows for multiple users to share the same frequency by injecting a sub-audible tone that distinguishes one carrier frequency from another |
| DTMF | Dual-Tone Multi-Frequency; signaling protocol involving two simultaneous tones representing a number or symbol. |
| Individual Paging | Signaling mode in which one Speaker is activated for operation |
| PCBA | Printed Circuit Board Assembly |

-continued

| | |
|---|---|
| RF | Radio Frequency |
| System Wide Paging | Signaling mode in which all speakers are activated for operation |
| 2-Tone | Signaling protocol involving two sequential tones of a predefined frequency and duration. |
| Zoned Paging | Signaling mode in which a group of speakers are activated for operation |

Referring to FIG. 1, an exemplary implementation of an amplified speaker assembly according to an embodiment of the invention includes a radio 1, which enable RF communication and control of the amplified speaker assembly and a line termination 2 which enables hardwire communication and control of the amplified speaker assembly. While FIG. 1 illustrates an implementation where both radio 1 and line termination 2 are provided for more flexibility, specific implementation, wireless versus hardwired, may omit radio 1 or line termination 2 to reduce cost, as desired.

An exemplary amplified speaker assembly of FIG. 1 includes audio gain circuits 2 and 5, DTMF decoding circuit 4, gain/filter circuit 6, microprocessor 8, amplifier 7, local volume control 9 and speaker 10. In this exemplary implementation, amplifier 7 may be implemented as a "Class D" amplifier, gain/filter circuit may be utilized for test tone generation, and microprocessor 8 may include circuitry for performing 2-tone decoding, audio control and tone generation.

An amplified speaker assembly according to an exemplary embodiment of the present invention is typically in a low-power sleep mode. In this state, the speaker amplifier and audio circuitry is disabled. The amplified speaker assembly enters its low-power sleep mode after a period of inactivity (no Carrier-Detect and Sub-Audible Detect, if applicable, or Page Closure input). The length of this period (Standby Time) may be preprogrammed in microprocessor 8. Optionally, the sleep mode operation may be disabled to provide continuous speaker output capability. The amplified speaker assembly "wakes up" when a Carrier-Detect or Page Closure input is activated. The audio circuitry and the speaker amplifier are energized at this time.

FIG. 1 represents an exemplary embodiment of an amplified speaker circuitry according to the present invention with inputs provided from both a 600-ohm (hardwired) and RF (wireless) source. Both sources 101 and 102 provide audio input to amplifier/interface 103, which sends the amplified audio to speaker amplifier 107. Speaker amplifier 107 will not provide an output to speaker 10 unless it has been enabled. Amplifier/interface 105 will detect a two-tone sequence and provide an audio output to the microprocessor 108 for speaker amplifier 107 activation. Additionally, the DTMF decoder 104, which will send the appropriate control signaling to the microprocessor 108 for speaker amplifier 107 activation, will decipher any detected DTMF strings. Control inputs from each source are also sent to the microprocessor 108 as instruction to enable the speaker amplifier 107 output if the appropriate DTMF or 102-tone codes are received (if required). If addressing is not required, these inputs will activate speaker amplifier 107 to allow transmission of the received audio.

If the proper DTMF code is received, the microprocessor 108 will send a volume control test tone control signal to gain/filter amplifier 106 and a digital gain control signal to amplifier/interface 103 for volume adjustment. Amplifier 106 will produce the test tone and send it to speaker amplifier 107 for volume change audio confirmation. The microprocessor 108 will also provide an Automatic Gain Control (AGC) loop to speaker amplifier 107 to prevent over-driving the amplifier.

Local Volume Control L-Pad 109 can be externally added to provide local volume control to speaker 110 if DTMF signal control is not available or not in use.

Figure 2:
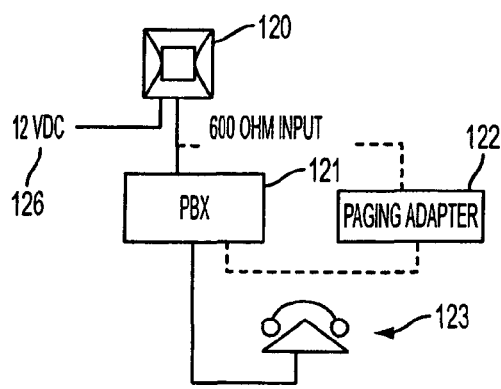
FIG. 2 shows an example of an implementation of an embodiment of the present invention.
Figure 7:
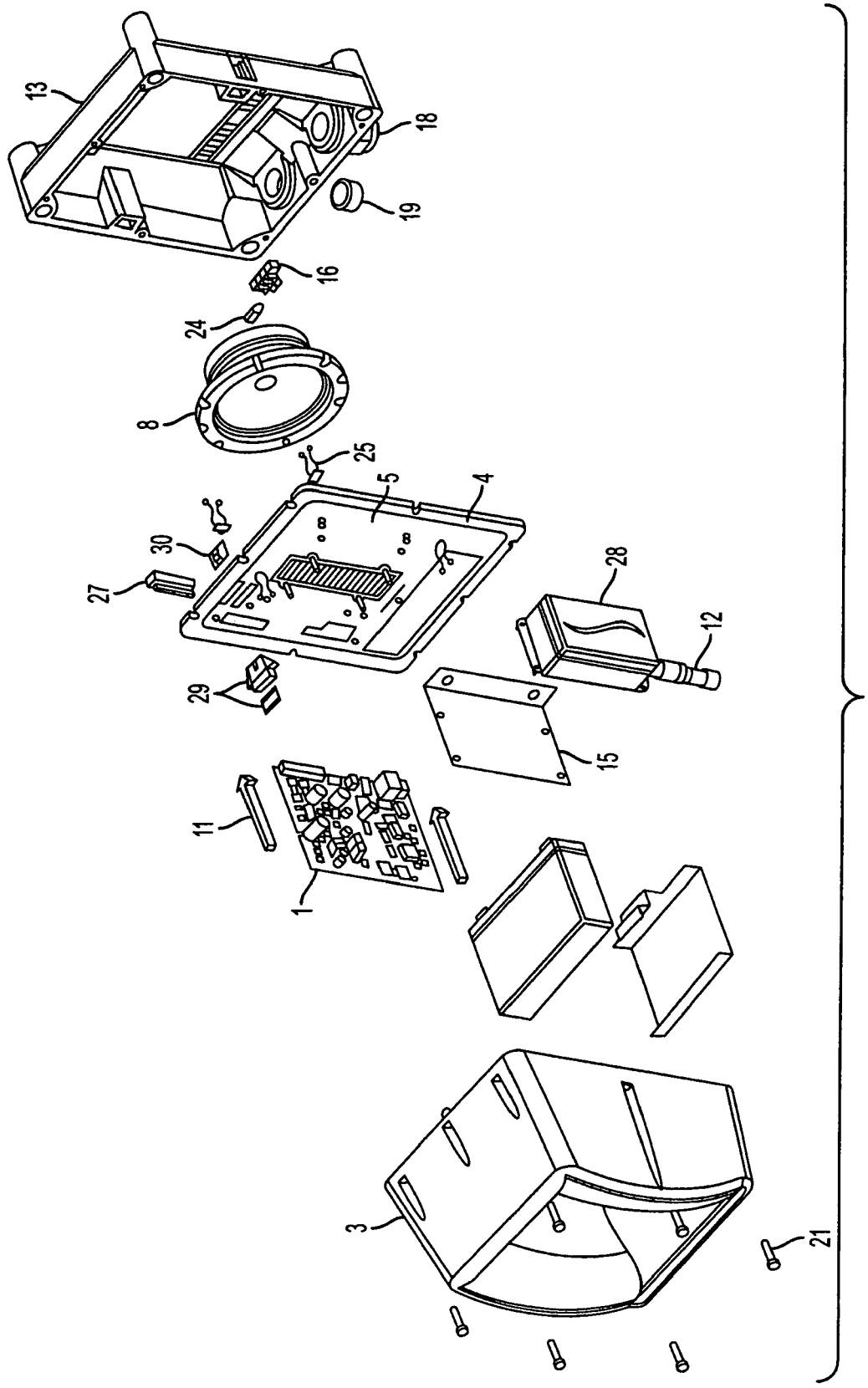
Figure 8:
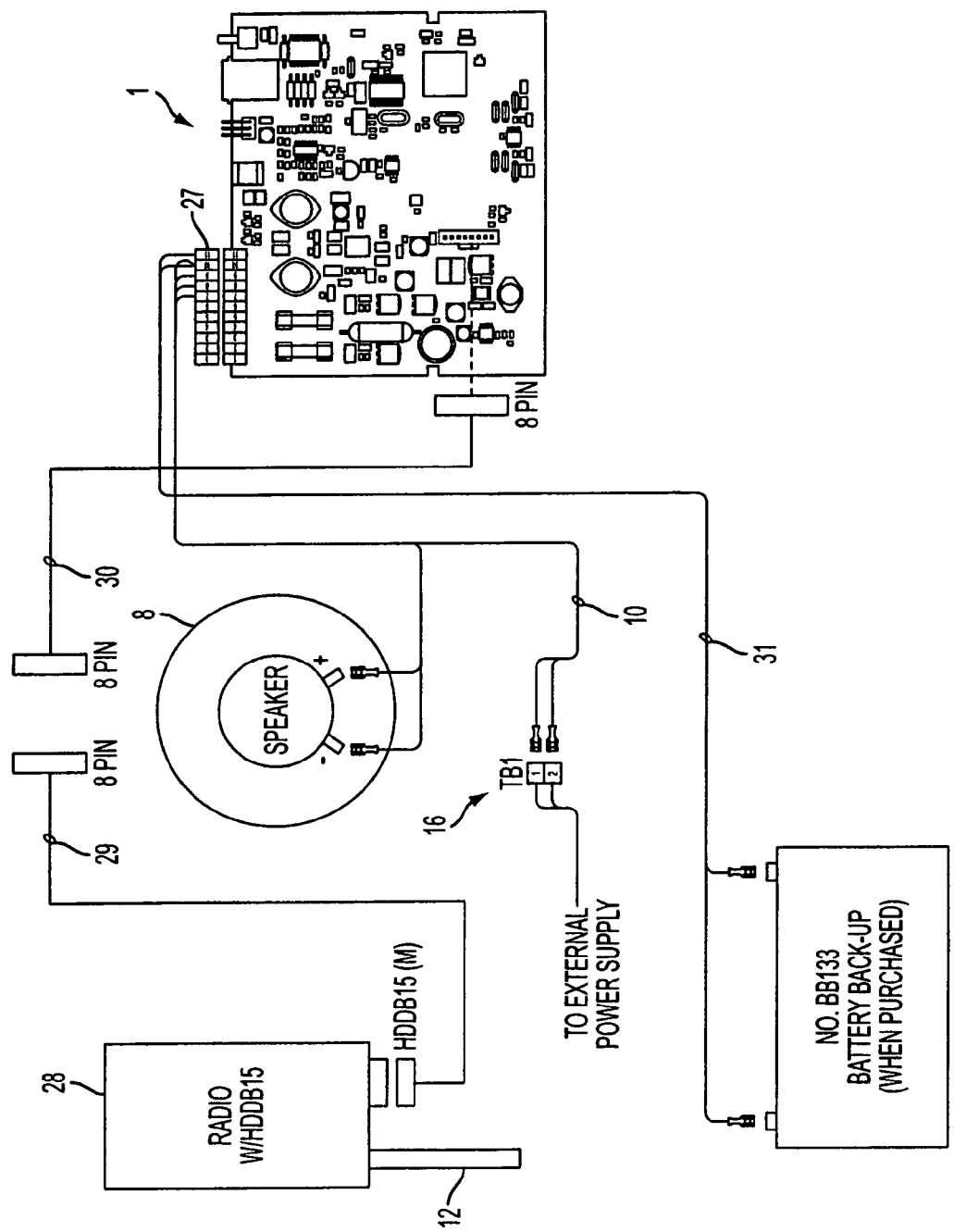
Figure 9E:
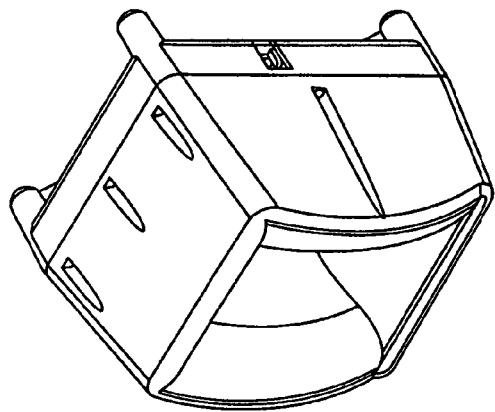
FIGS. 9-11 which provide a detailed illustration of an exemplary implementation of a wireless amplified speaker assembly according to an embodiment the present invention.
Figure 9B:
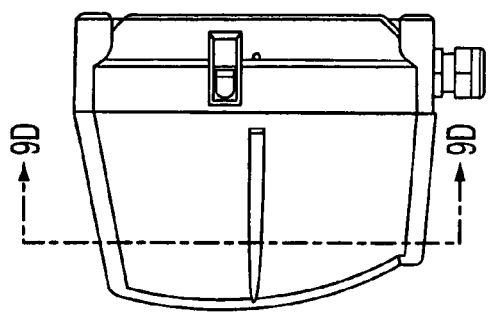
Figure 9D:
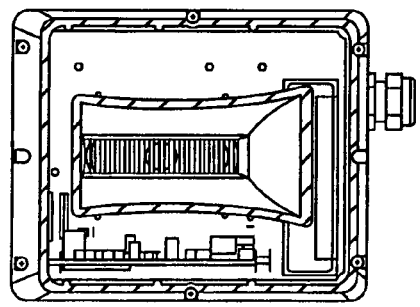
Figure 9A:
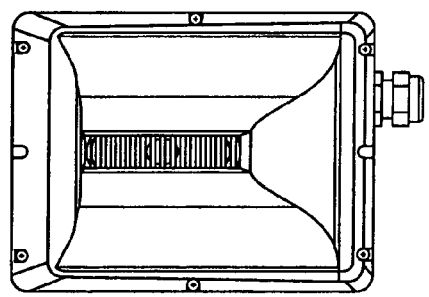
Figure 9C:
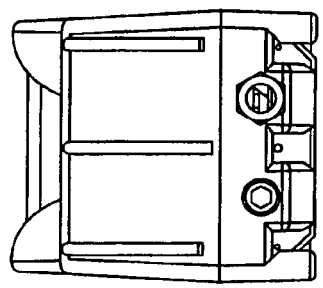
Figures 1, 12A:
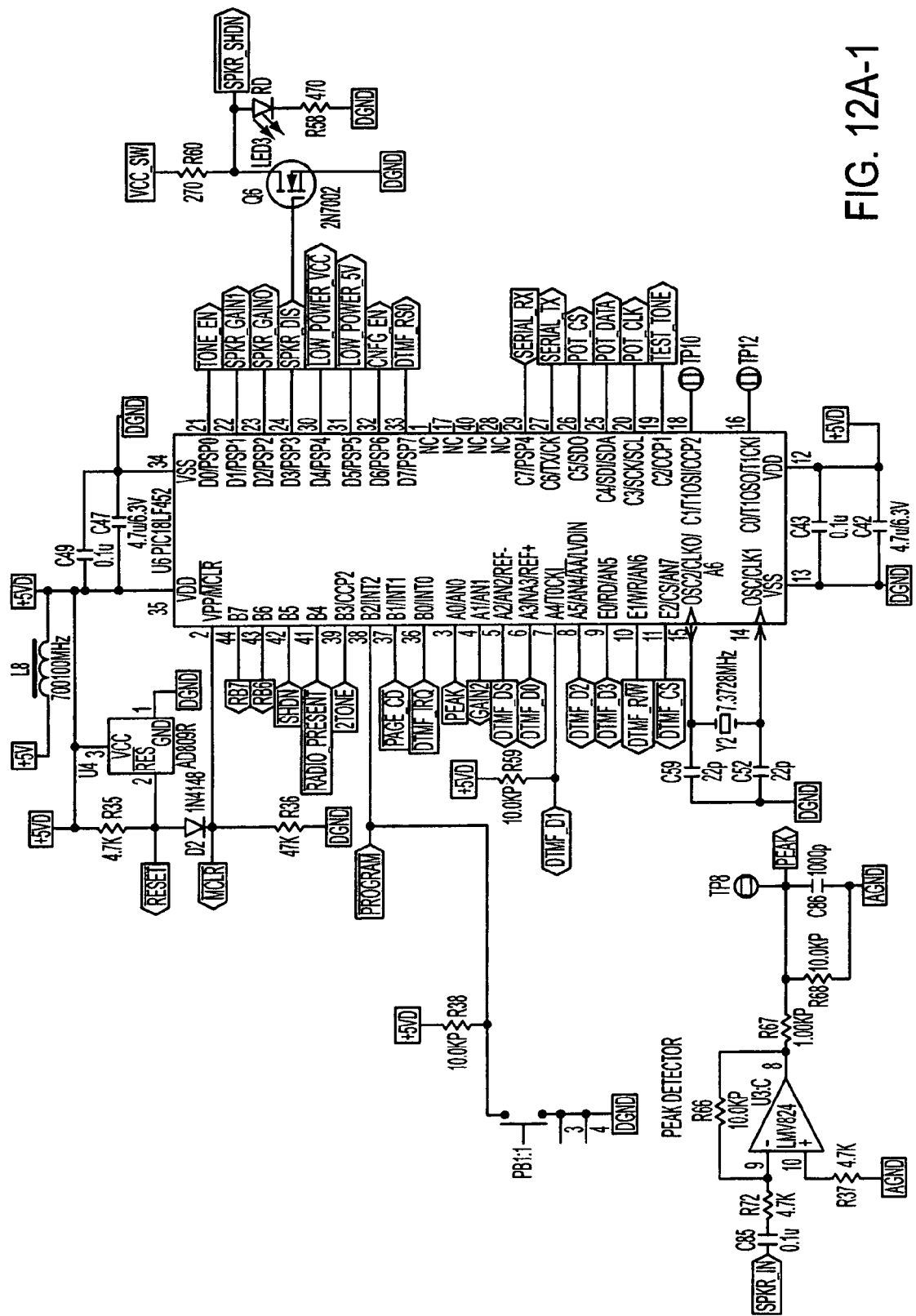
FIGS. 12A-12C provide circuit diagrams for an exemplary implementation of an amplified speaker assembly according to an embodiment the present invention.
Figures 2, 12A:
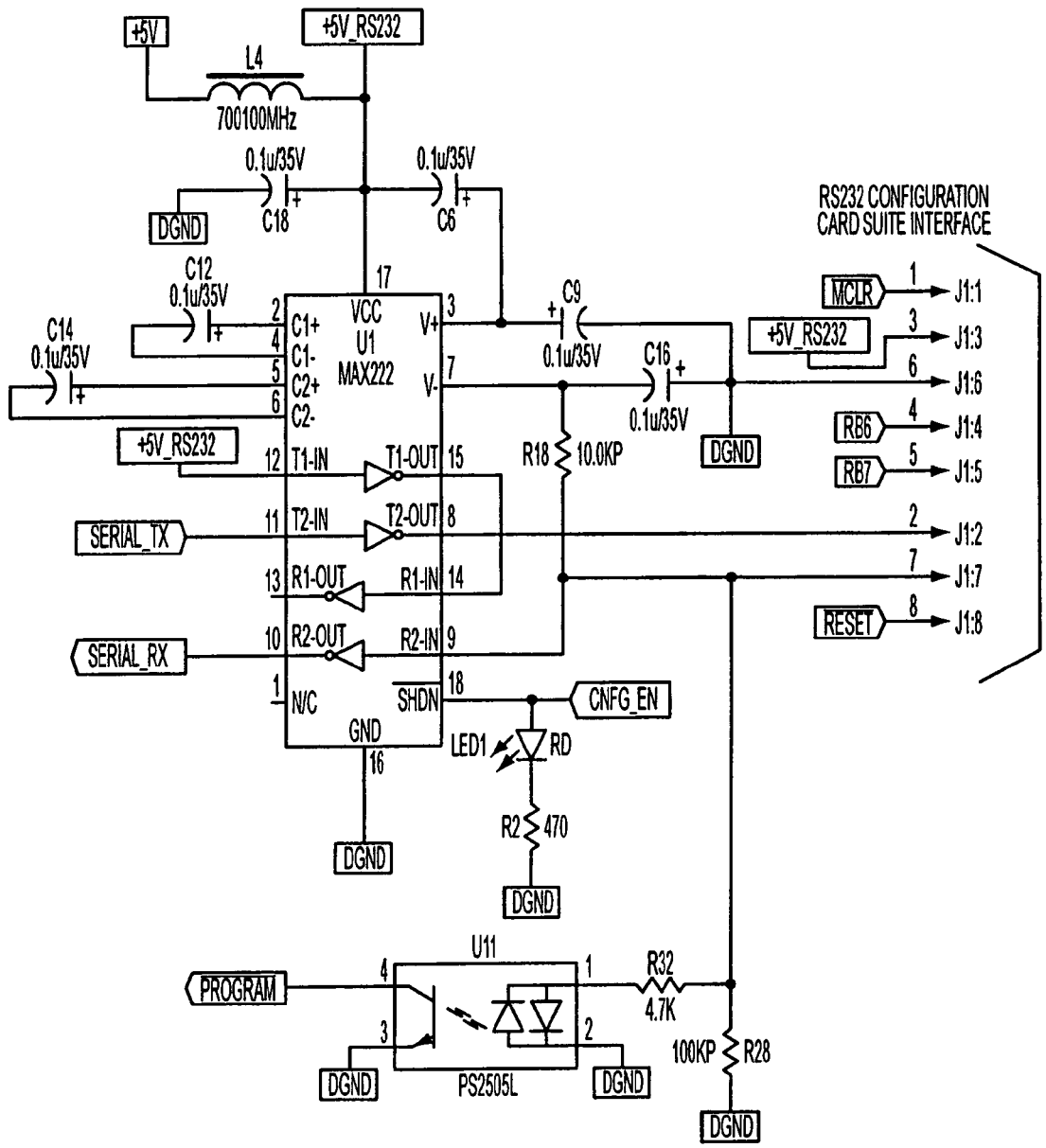
Figures 1, 12B:
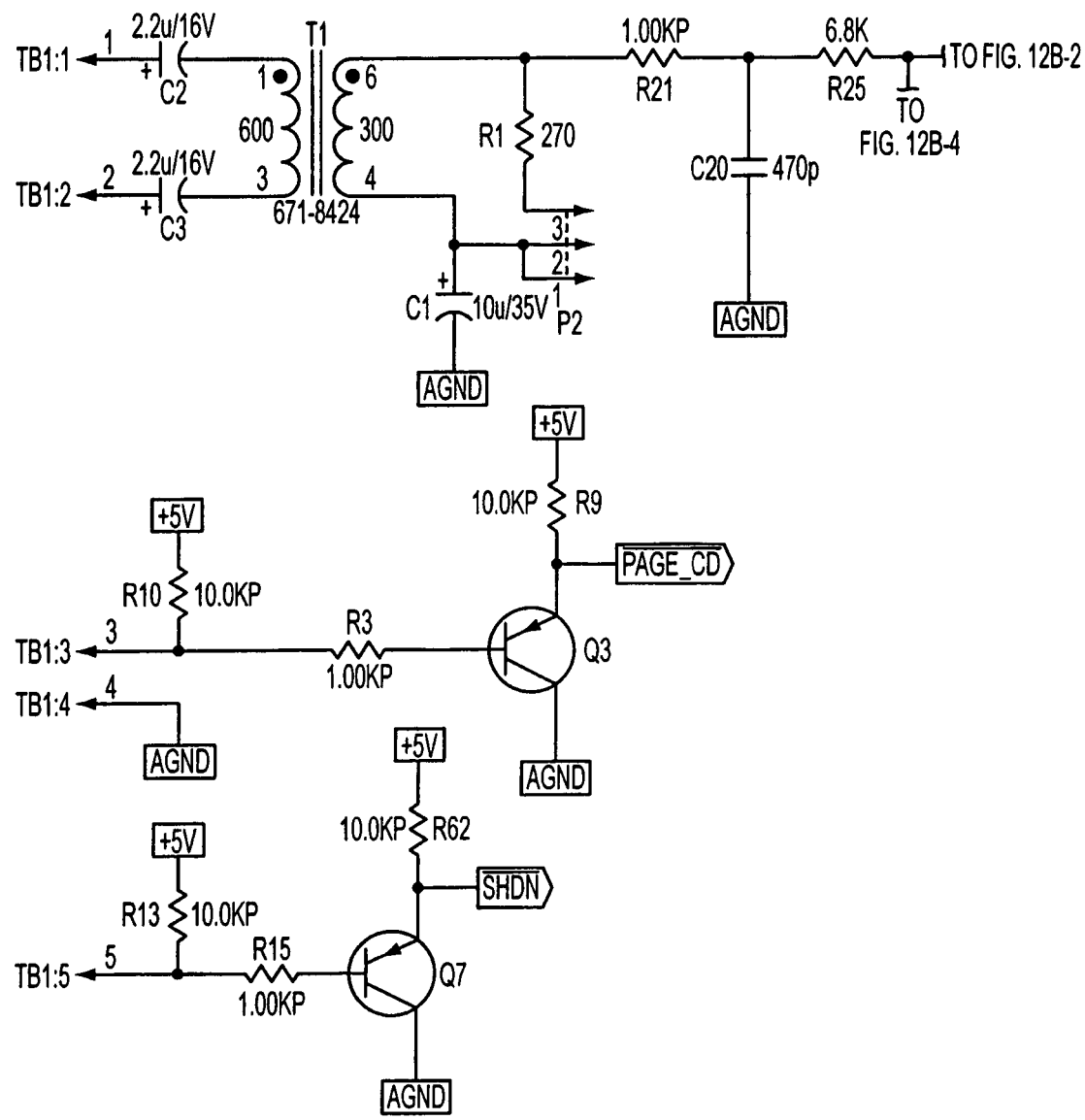
Figures 2, 12B:
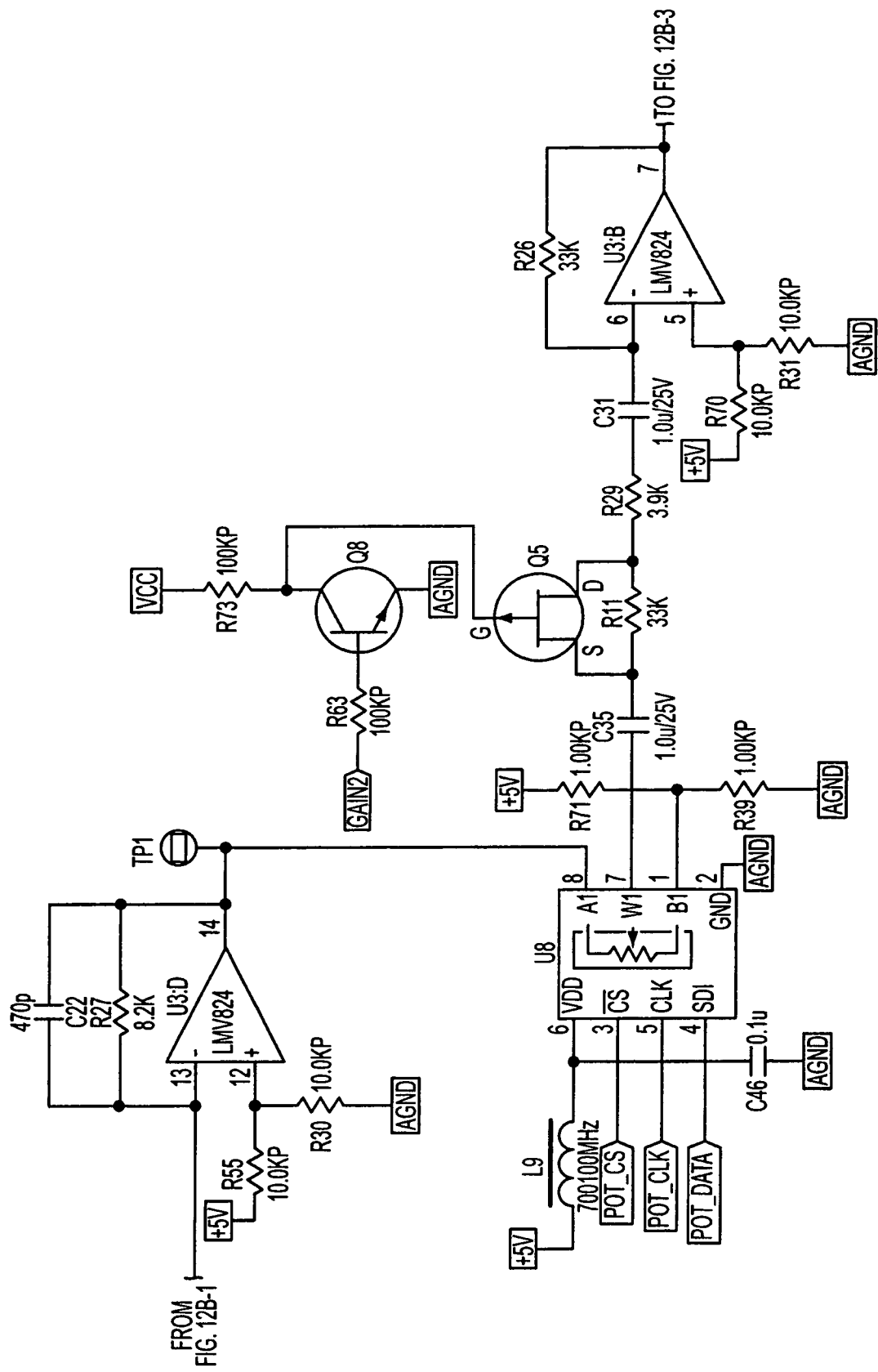
Figures 3, 12B:
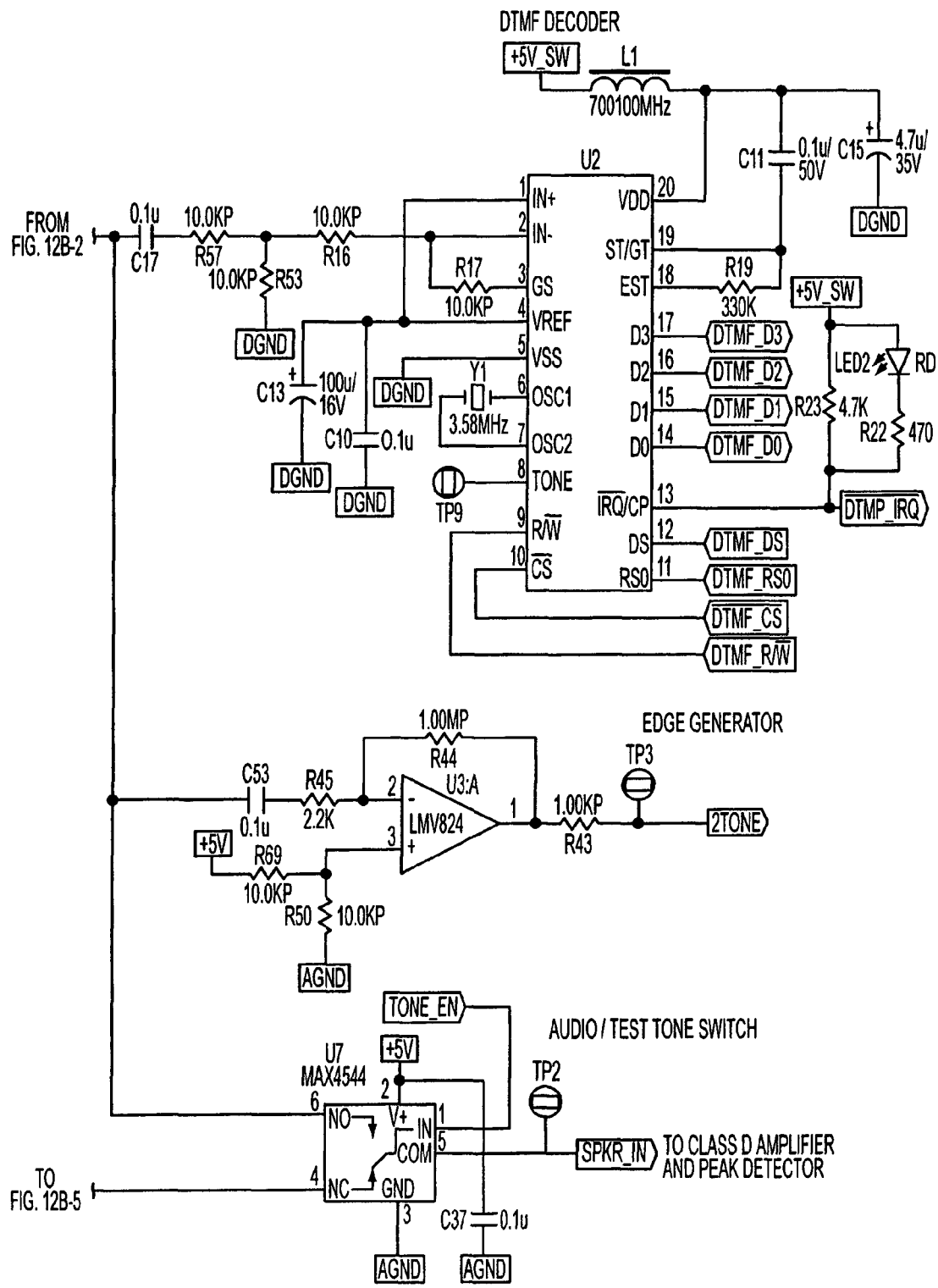
Figures 4, 12B:
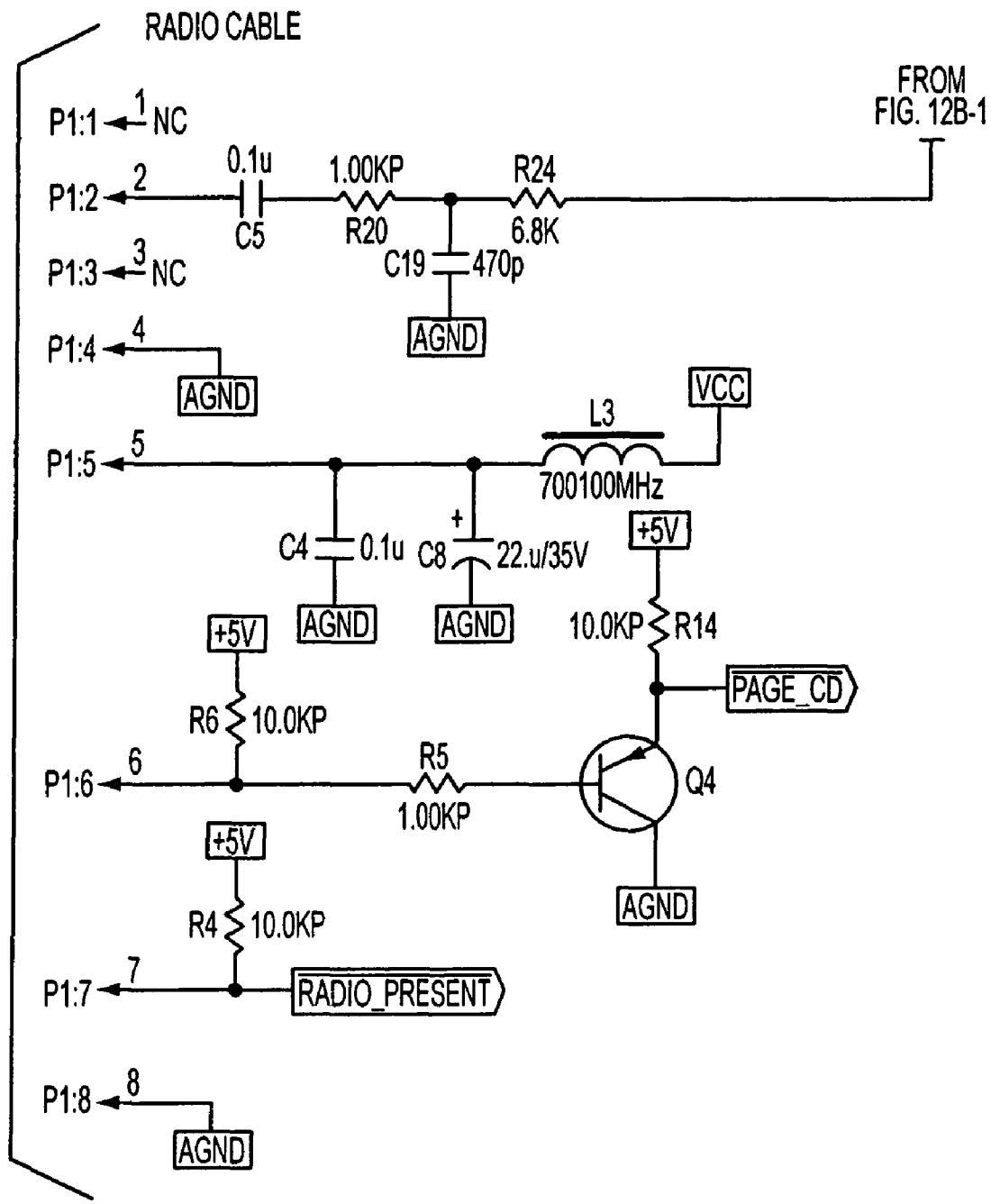
Figures 5, 12B:
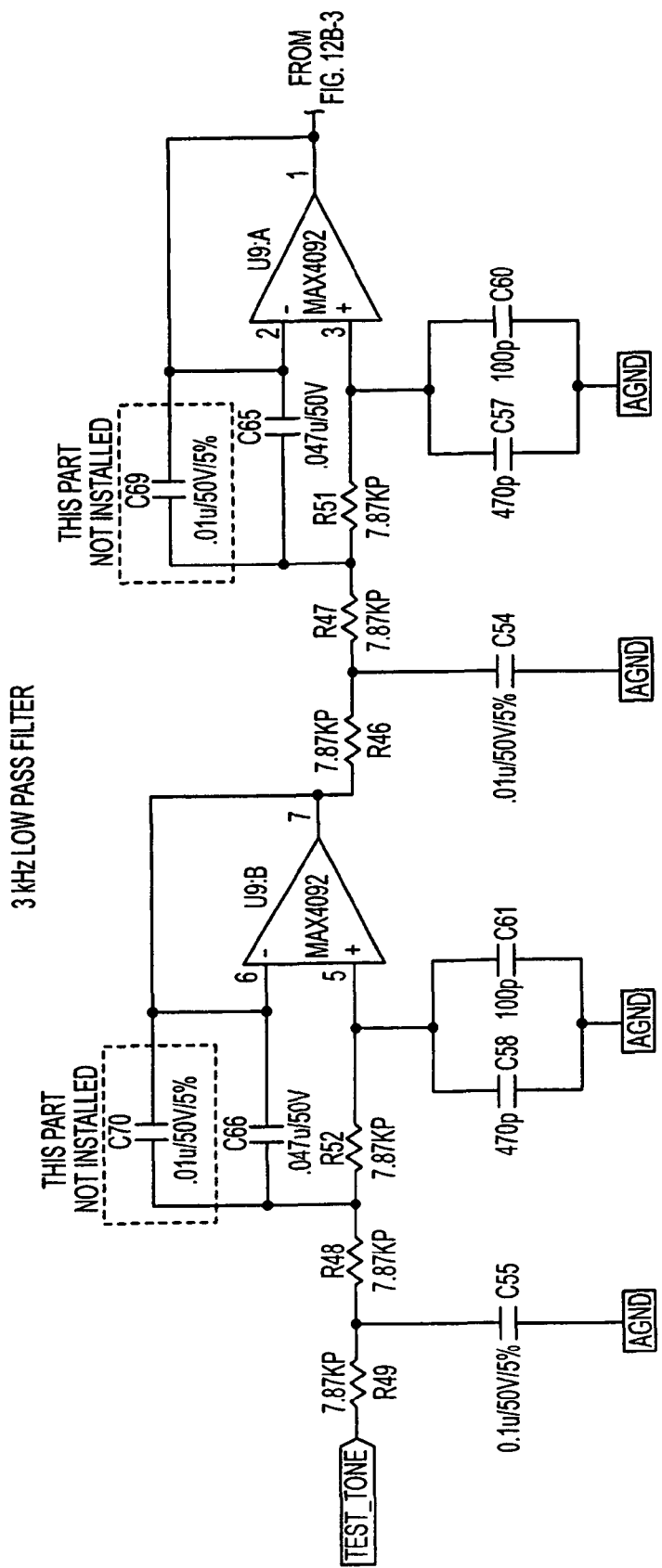
Figures 1, 12C:
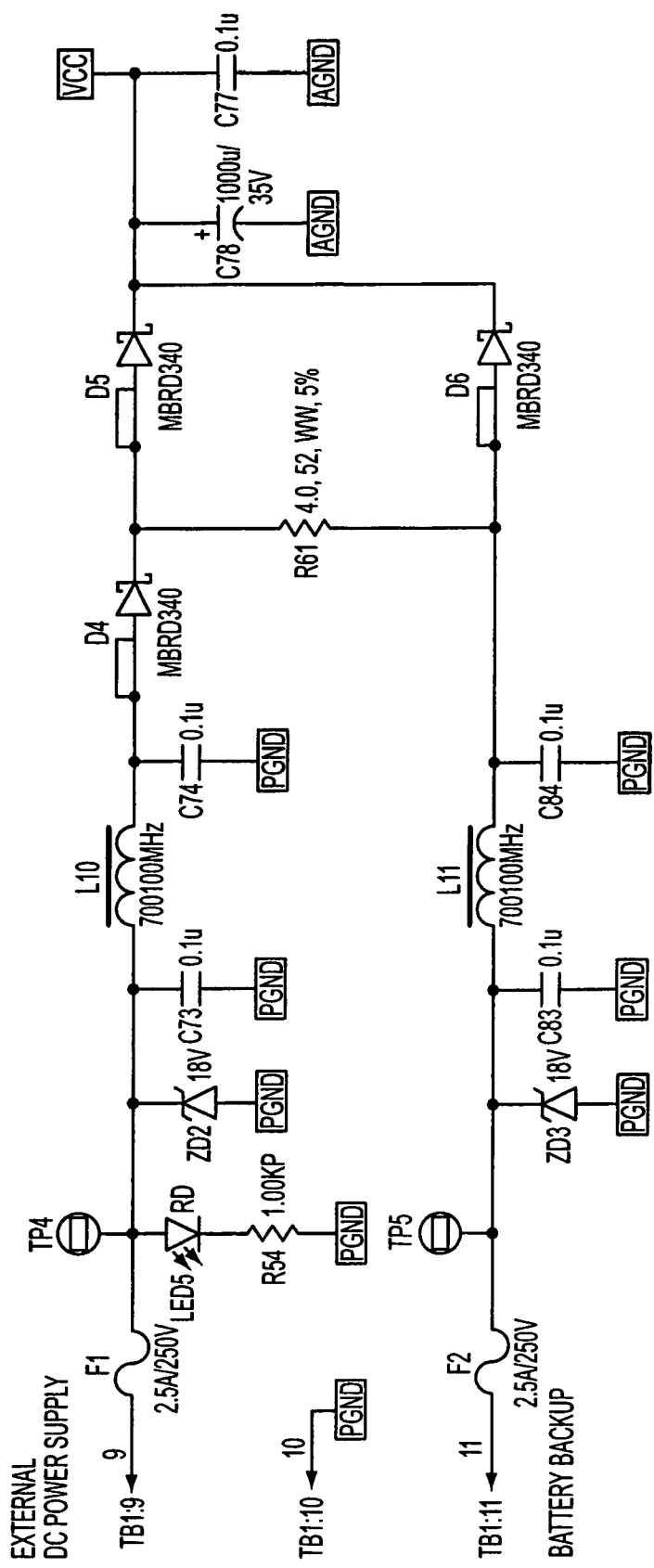
Figures 2, 12C:
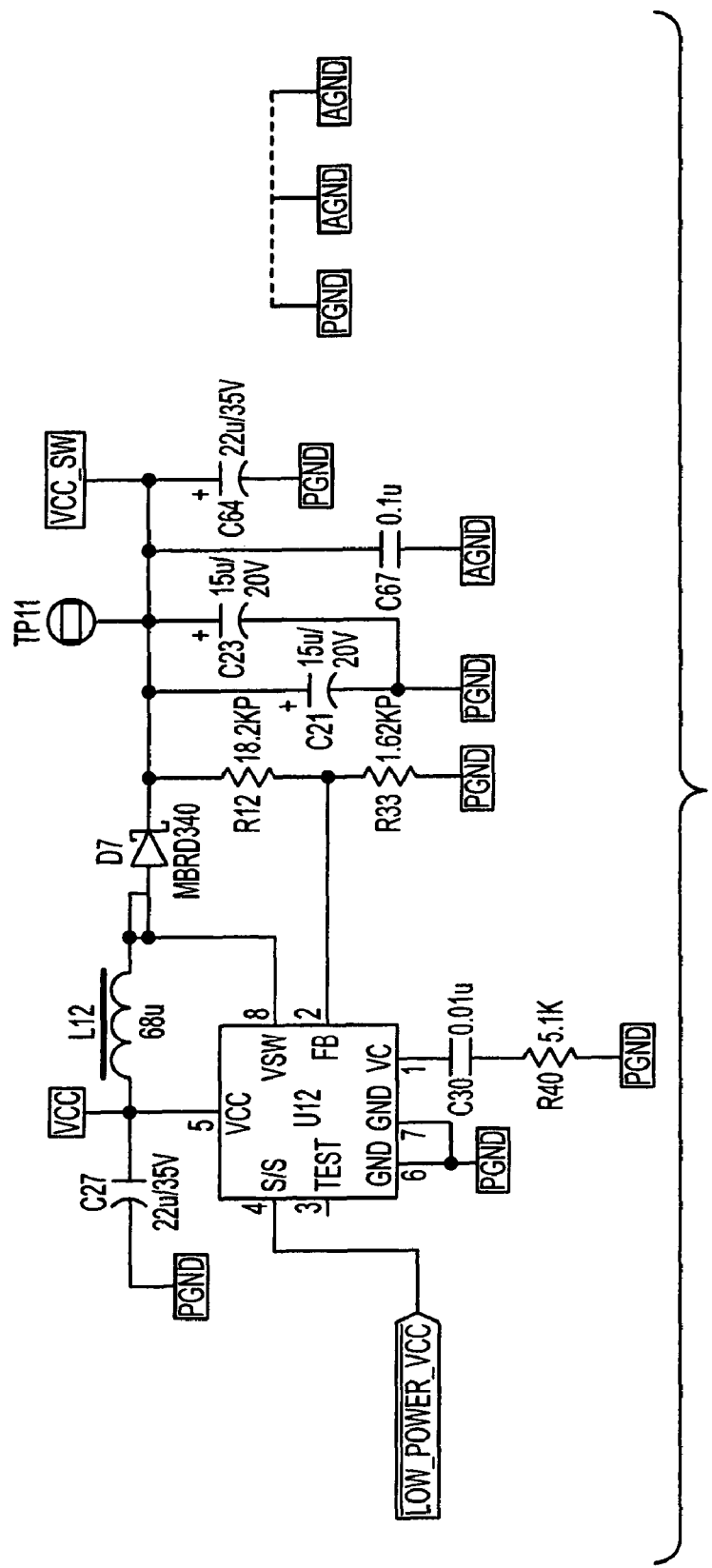
Figures 3, 12C:
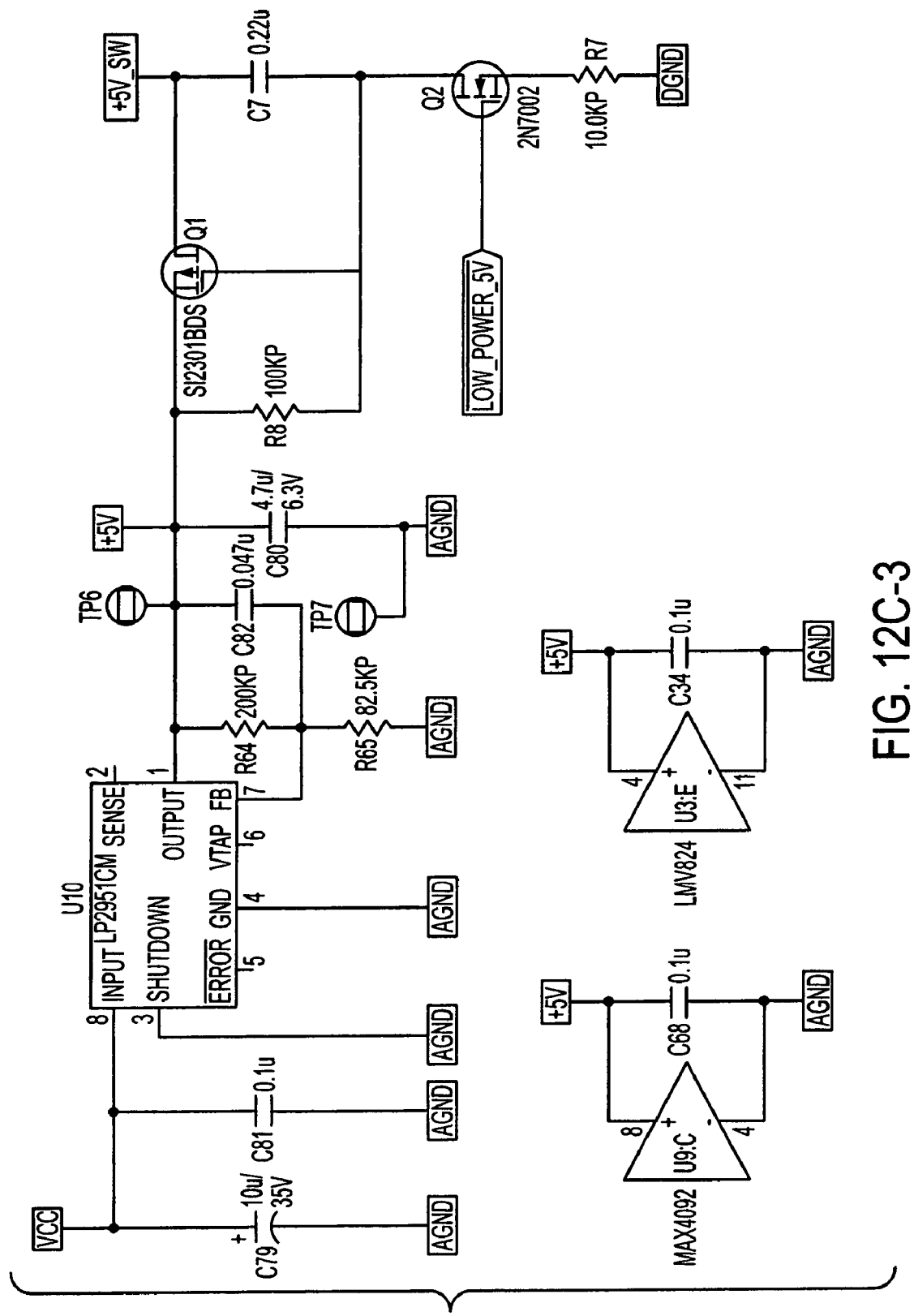
Figures 4, 12C:
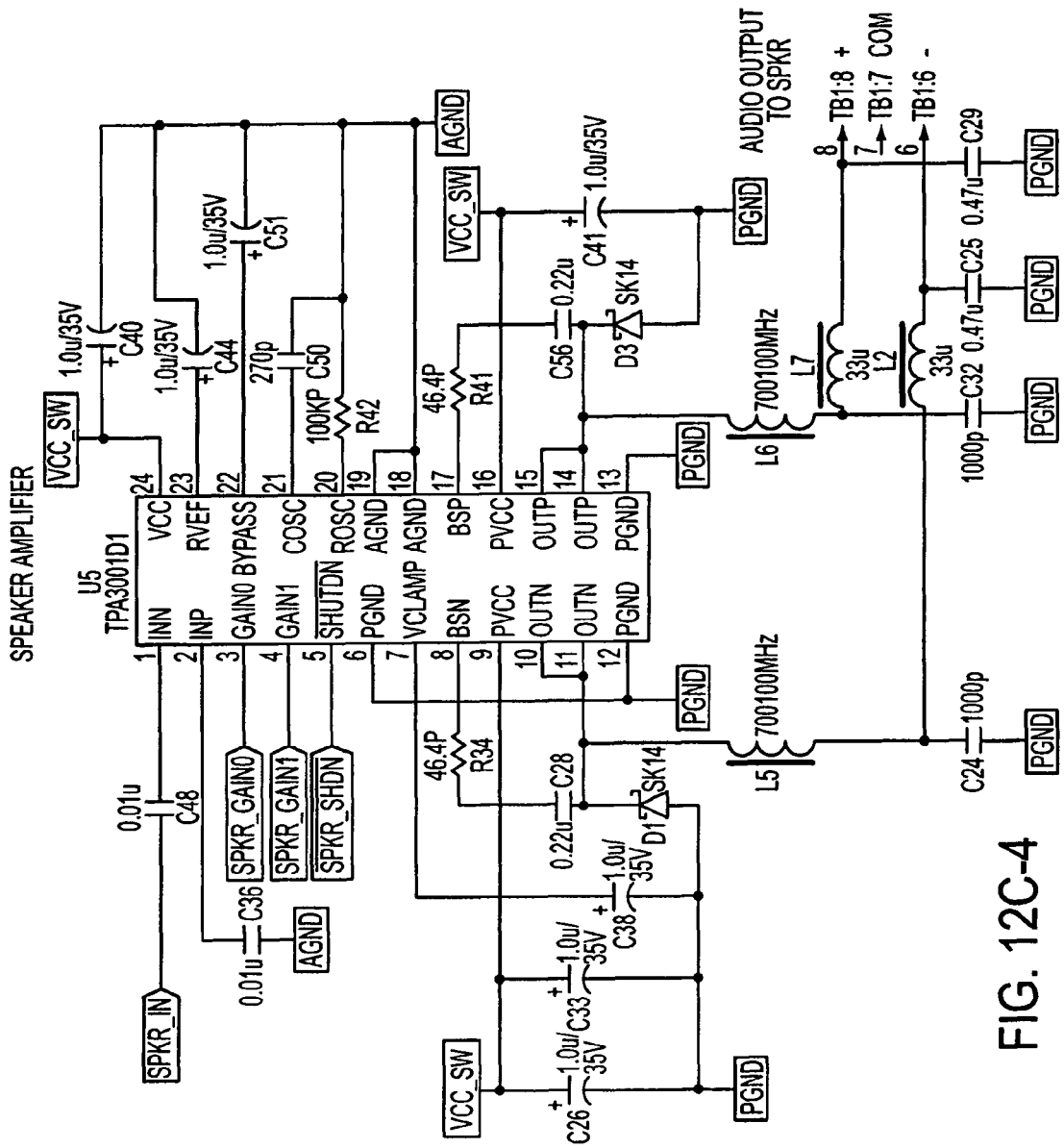

FIG. 2 represents an exemplary utilization of an amplified speaker assembly (600-ohm, hardwired input) 120 with a telephone system. (See also FIGS. 6-8 which provide a detailed illustration of an exemplary implementation of an amplified speaker assembly 120, and FIGS. 12A-12C provide circuit diagrams for an exemplary implementation of an amplified speaker assembly according to an embodiment the present invention.) Telephone 123 will dial either the page port extension of the telephone system PBX 21 or paging adapter 122, utilizing its DTMF keypad. PBX 21 or paging adapter 122 will provide a 600-ohm, 0dBm audio output accompanied by a dry contact closure to the amplified speaker 120. If DTMF signal addressing is not being used, the speaker amplifier circuit (7 from FIG. 1) will activate and reproduce the audio transmitted from telephone 123. If DTMF signal addressing is programmed for use, telephone 123 will be required to enter the appropriate DTMF code to activate the speaker amplifier circuit (7 from FIG. 1) in the amplified speaker 120 using its DTMF keypad. A 12VDC source 126 is required to provide power to the amplified speaker 120.

Figure 3:
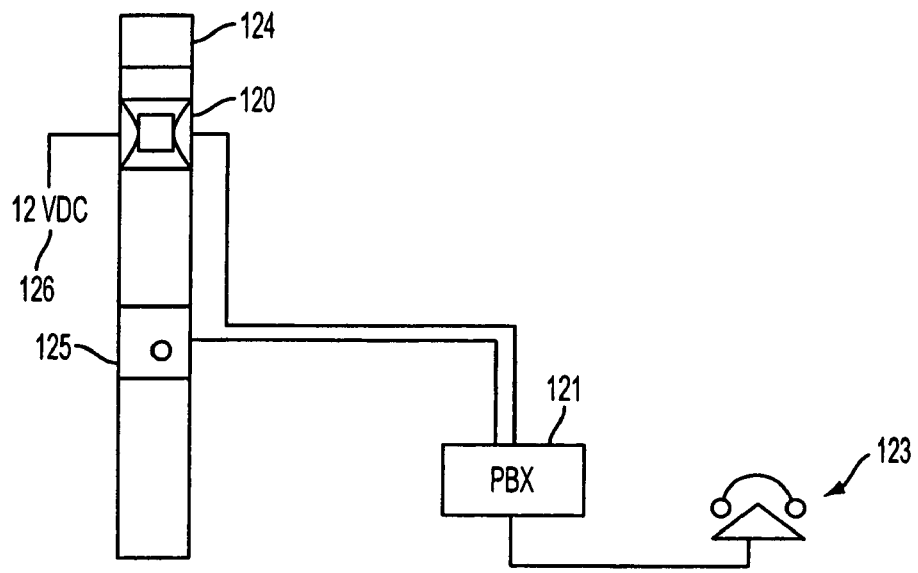
FIG. 3 shows another example of an implementation of an embodiment of the present invention.

FIG. 3 represents an exemplary utilization of an amplified speaker assembly similar functionality as the representation in FIG. 2, with the addition of a stanchion 114 and Industrial Telephone 121. Accessing the amplified speaker 120 is accomplished in the same method as described in the FIG. 2 scenario. Telephone 123 can also call the Industrial Telephone 125, via the PBX 121, in normal telephone to telephone communication. This figure simply represents an alternative packaging method, allowing the telephone 123 to both communicate with the industrial telephone 125 as well as provide public address area paging via the amplified speaker 120 mounted to the stanchion 124. A 12VDC source 126 is required for operation.

Figure 4:
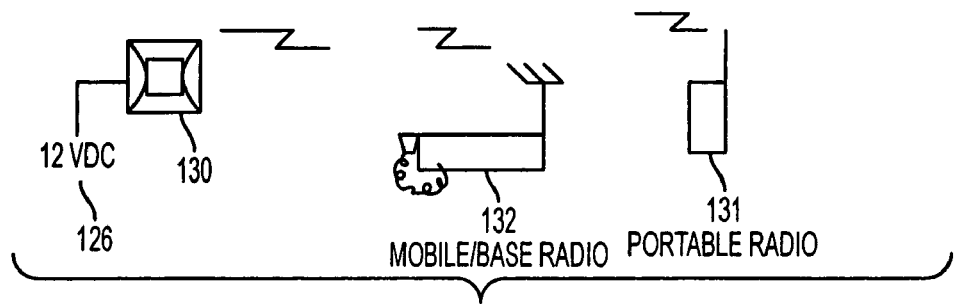
FIG. 4 shows another example of an implementation of an embodiment of the present invention.
Figure 10:
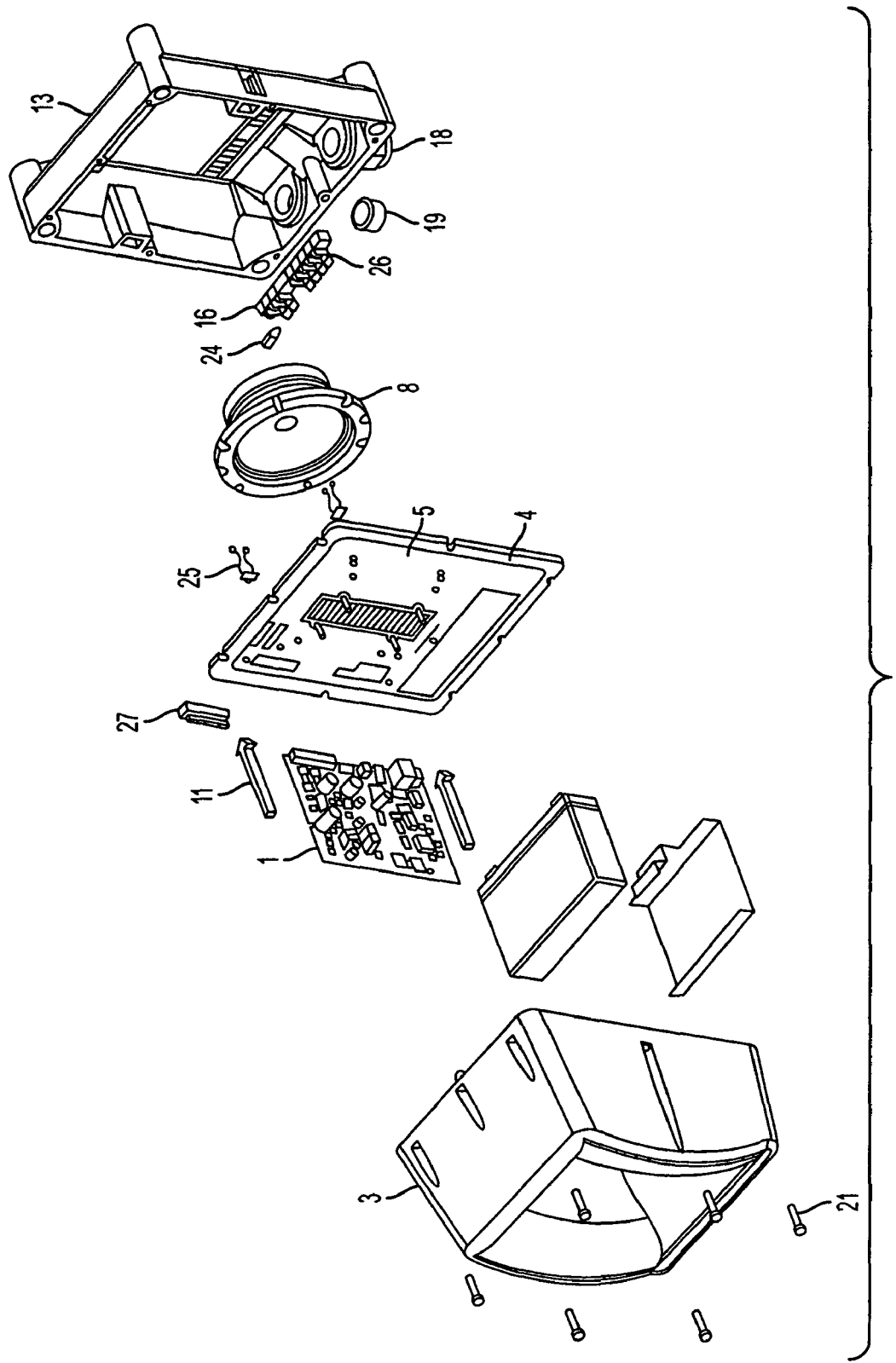
Figure 11:
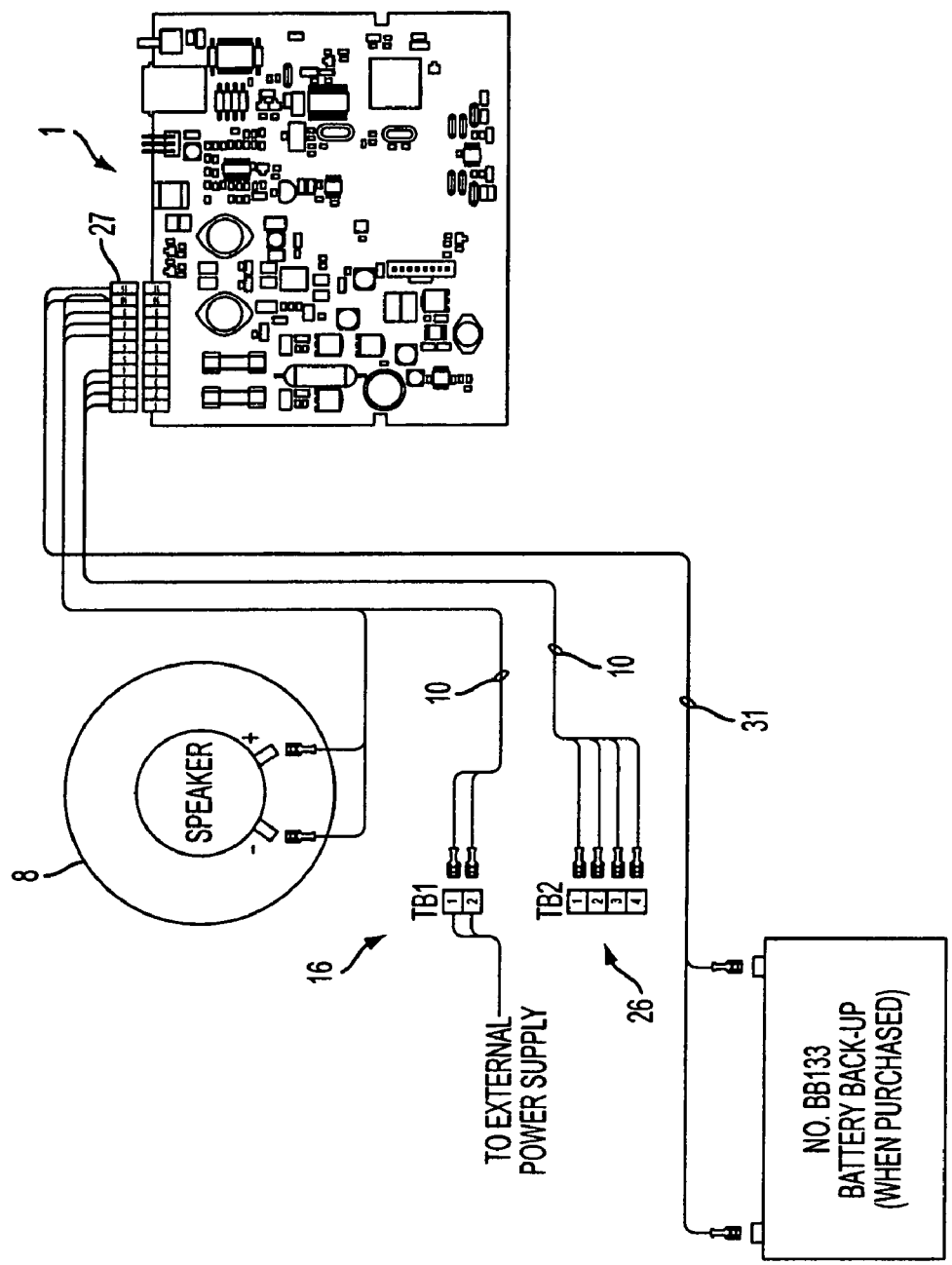

FIG. 4 represents an exemplary utilization of an amplified speaker assembly 130 with any portable radio 31 or mobile/base station radio 132. (See also FIGS. 9-11 which provide a detailed illustration of an exemplary implementation of an amplified speaker assembly 130, and FIGS. 12A-12C provide circuit diagrams for an exemplary implementation of an amplified speaker assembly according to an embodiment the present invention.) A radio transmitting on the appropriate frequency and PL tone can access the amplified speaker 130. Audio and DTMF or two-tone signaling transmitted from radio 131 or 132 will be received by the radio (1 from FIG. 1) and processed as stated in the FIG. 1 representation statement. A 12VDC source 126 is required for operation.

Figure 5:
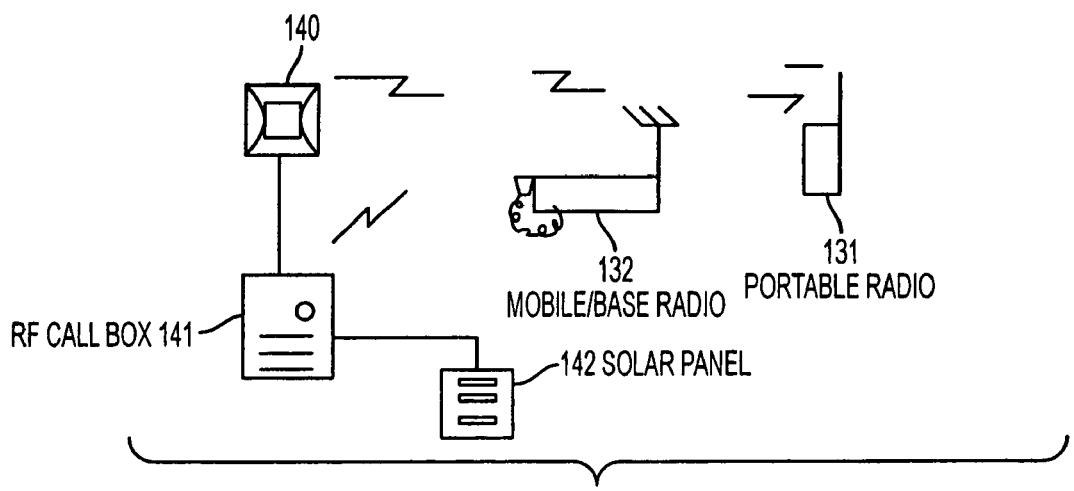
FIG. 5 shows another example of an implementation of an embodiment of the present invention.
Figure 6E:
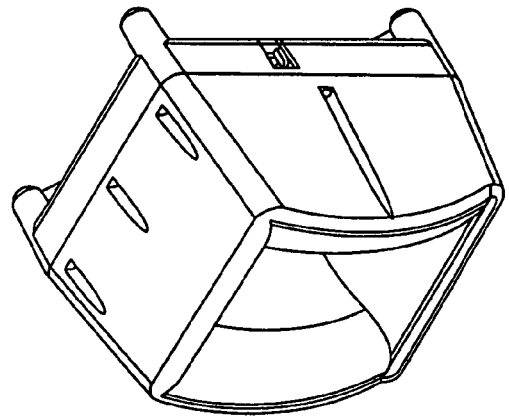
FIGS. 6-8 which provide a detailed illustration of an exemplary implementation of a hardwired amplified speaker assembly according to an embodiment the present invention.
Figure 6B:
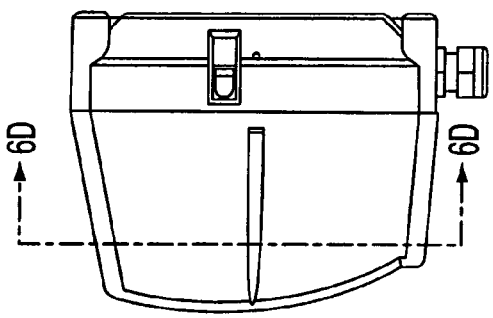
Figure 6D:
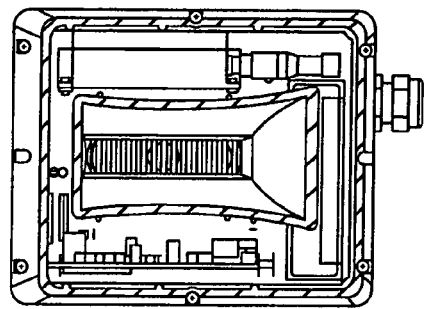
Figure 6A:
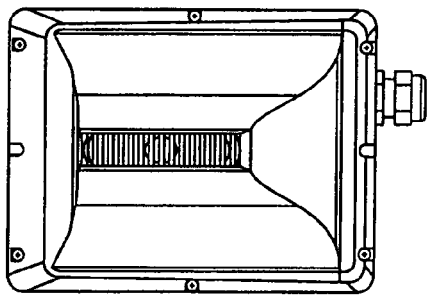
Figure 6C:
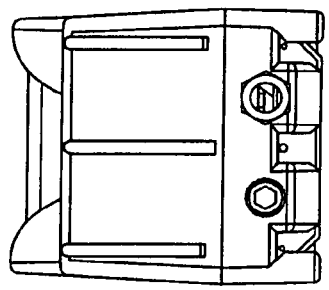

FIG. 5 represents an exemplary utilization of an amplified speaker assembly 140 with any portable radio 131 or mobile/base station radio 132. A radio transmitting on the appropriate frequency and PL tone can access the amplified speaker 140. Audio and DTMF or two-tone signaling transmitted from radio 131 or 132 will be received by the radio (1 from FIG. 1) and processed as stated in the FIG. 1 representation statement. This configuration differs from that represented in FIG. 4 in that a RF Call Box 141 with associated Solar Panel 142 have been added. The RF Call Box 41 houses a solar charge regulator module to which the solar panel is connected. In this representation, the amplified speaker 140 would be equipped with an optional back-up battery (installed inside the amplified speaker 140). The amplified speaker 40 12VDC input connection would connect to the 12VDC output of the charge regulator module inside the RF Call Box 141. This would allow the solar panel 142 to charge both the amplified speaker 140 battery as well as the RF Call Box 141 battery. This configuration eliminates the need for a separate 12VDC power source to be connected to the 10 amplified speaker 140. Additionally, both the 101 amplified speaker 140 and the RF Call Box 141 can operate on the same frequency. If programmed for DTMF addressing, the amplified speaker 140 will only broadcast audio when the appropriate DTMF code is received.

The elements shown in FIGS. 6-12C are as follows:

FIGS. 6-8

| No. | Description |
|---|---|
| 1 | PCB Assembly |
| 2 | Gasket Assembly |
| 3 | Steel Mounting Plate |
| 11 | Lock PCB Card Guide |
| 12 | VHF Antenna, 152–160 MHz |
| 15 | RF Module Mounting Bracket |
| 24 | Snap-in Nylon Tie |
| 27 | 11-pt. Plug, 180-degree, removable |
| 28 | RF Module, VHF (13362) |
|  | RF Module, UHF (13372) |
| 29 | 15-Pin, High Definition, Sub-D to 8-pin Receptacle Cable |
| 30 | RF Module Connection Cable |
| 2 | GAI-Tronics/Speaker 13362/13372 Label |
| 3 | Horn Enclosure - Front |
| 8 | Speaker, 5", 16 watt, 8-ohm |
| 13 | Horn Enclosure - Rear |
| 14 | Terminal Block Label |
| 16 | 2-pt. Terminal Block |
| 18 | ¾" Cable Bushing |
| 19 | Hex Socket Plug, ¾" NPT |
| 20 | Identification Label |
| 24 | Tie Anchor Mount |
| 26 | 4-pt. Terminal Block |
| 31 | Tie Anchor Mount |
| 80 | Service Label with Bar Code/Serial Number |

FIGS. 9-11

| No. | Description |
|---|---|
| 1 | PCB Assembly |
| 4 | Gasket Assembly |
| 5 | Steel Mounting Plate |
| 11 | Lock PCB Card Guide |
| 25 | Snap-in Nylon Tie] |
| 27 | 11-pt. Plug, 180 degree, removeable |
| 4 | GAI-Tronics/Speaker 13352 Label |
| 5 | Horn Enclosure - Front |
| 8 | Speaker, 5", 16 watt, 8-ohm |
| 13 | Horn Enclosure - Rear |
| 14 | Terminal Block Label |
| 16 | 2-pt. Terminal Block |
| 18 | ¾" Cable Bushing |
| 19 | Hex Socket Plug, ¾" NPT |
| 20 | Identification Label |
| 25 | Tie Anchor Mount |
| 26 | 4-pt. Terminal Block |
| 31 | Tie Anchor Mount |
| 80 | Service Label with Bar Code/Serial Number |

The amplified speaker assembly does not energize the DTMF decoding circuit 4 if that finctions is not programmed into the amplified speaker assembly. If the DTMF decoding is used, the DTMF decoding circuit 4 is energized during the "wake up" conditions.

Amplified speaker assembly may be powered by, for example, a 12VDC power source which may be an external power source connected to an AC power source, or an internal stand alone power supply such as an electrochemical battery, solar panel/battery, rechargeable-type battery, or any combinations thereof. A rechargeable-type battery may be constantly charged through circuitry on the PCBA of the amplified speaker assembly when an external power source is connected.

The audio input to the PCBA comes from the Page-Port line connector or the RF Receiver. The signal is then sampled by the microprocessor and amplified to the speaker output through the AGC. The Automatic Gain Control (AGC) volume control is used to create a constant speaker output regardless of assembly input signal level. The microprocessor 8 compares the known reference signal, from the volume control, to the audio input. The gain for the audio signal is adjusted so that the audio signal is the same as reference signal at the input to the speaker amplifier. The audio output from the microprocessor to the speaker amplifier is used for volume setting. The output from the microprocessor is a PWM (Pulse Width Modulation) signal. The signal is then condition through filtering to the speaker amplifier.

The assembly can perform either DTMF detection or 2-Tone Detection but not both simultaneously.

A default operation of an amplified speaker assembly according to an exemplary embodiment of the present invention uses no DTMF Signaling or 2-Tone Signaling, amplified speaker assembly shall broadcasts all audio if the correct Carrier-Detect and Sub-Audible Detect, if applicable, or Page Closure signal is activated.

For DTMF signal detection, DTMF code may be programmed into an amplified speaker assembly through a software interface. A protocol for the DTMF symbol stream during normal operation may be a programmed digit length (2-8) followed by a "#" DTMF symbol. The DTMF symbol stream may not use "*" or "#" in its identification string. If the DTMF code in an amplified speaker assembly is blank, the amplified speaker assembly does not have that functionality.

For 2-Tone Signaling in an amplified speaker assembly, the Protocol follows could be that defined by Motorola Quick Call II or similar. As in the case of DTMF signal detection. the 2-Tone may be programmed into an amplified speaker assembly through a software interface. The 2-Tone protocol is one frequency followed by a second frequency. If the 2-Tone code in an amplified speaker assembly is blank, the amplified speaker assembly does not have that functionality.

An amplified speaker assembly according to an embodiment of the present invention performs Carrier Detection. The functionality is incorporated in the receiver and is not programmed on the PCBA. The receivers programming kit shall be used for programming the Carrier-Detect Signal and may not require removal of the receiver to program.

An amplified speaker assembly according to an embodiment of the present invention performs Sub-Audible Signal Detection. The signals can be CTCSS or CDCSS. The fimctionality is incorporated in the receiver module and is not programmed on the PCBA. The receiver's programming kit shall be used for programming the Coded Squelch Signal and may not require removal of the receiver to program.

For DTMF or 2-Tone operation, an amplified speaker assembly according to an embodiment of the present invention may be configured to recognize, for example, eight codes which can be used for unit activation. Any of the eight codes can be used for individual, zone or all paging fínctionality. The system coordinator can configure the codes to best fit their system requirements including several different zone applications.

An amplified speaker assembly according to an embodiment of the present invention may monitor the amount of time the speaker amplifier remains active without Carrier-Detect and Sub-Audible Detect, if applicable, or Page Closure input. At the end of the time out period, the speaker amplifier may be deactivated. The Standby Time may be programmed in the amplified speaker assembly via a software interface.

An amplified speaker assembly according to an embodiment of the present invention may perform Volume Adjustment in one of two ways; Remote Volume and optional Local Volume Adjustment. The default volume level may be programmed through a software interface. The remote volume adjustment may be done by use of a DTMF control only. For example, an amplified speaker assembly may receive an audio level from the DTMF signal and deliver a 1 kHz signal to the speaker output corresponding to the volume level defined. The protocol for initiating remote volume control may involve, for example, the Individual Assembly Identification with the volume level followed by a "#". The DTMF scale may be 1-10, 1 being the minimum and 10 being the maximum signal level. During the test tone, the user can change the volume level by sending a new volume level setting or increment or decrement the setting by one. The new volume level command will be the 1 -10 scale without the Assembly Identification. The increment will be "*" and the decrement will be "#" without the Assembly Identification. If the unit receives no input during the test tone the assembly stores the value in memory and returns to sleep mode. This stored level is used as a reference for incoming audio signals and the appropriate Gain required in the AGC for stable output volume level.

The Local Volume Adjustment is done by a "L-Pad" 9 connected to the speaker 10 output. No test tone is generated during this adjustment. The user may generate their own audio for this test. This is a passive adjustment. The maximum output level is defined by software or Remote Volume Adjustment. For example, the Local Volume Adjustment can only adjust the Output Level lower than the maximum programmed level.

An amplified speaker assembly according to an embodiment of the present invention is capable of interfacing to a serial RS232 port for software configuration. All configuration data may be transmitted, for example, asynchronously at 9.6Kbaud (9600 bits/sec). The data format may, for example, be 8 data bits, 1 start bit, 1 stop bit, no parity and no flow control. Programmable configuration settings may include, but are certainly not limited to, for example:

- In Radio 600-ohm Mode, ability to distinguish between radio and 600-ohm mode operation by the presence of a radio module 1. If the radio in present, the features for radio programming may be made available for modification. If the radio is not present, the features for 600-ohm programming may be made available for modification.
- 2-tone signaling may only be available for the radio mode operation.
- Ability to choose between General and Selective Mode of operation. If General Mode is selected, the speaker may broadcast any audio present at its input. In Select Mode, the speaker amplifier may be muted until the unit receives the appropriate pre-programmed DTMF or 2-Tone code.
- The default may be programmed to be General Mode.
- The user may choose between DTMF and 2-Tone in the Select Mode. If DTMF Mode is selected, the amplified speaker assembly according to an embodiment of the present invention may decode a DTMF signal for assembly addressability and volume control. The DTMF signal may be entered by the user with numeric symbols (0-9). In 2-Tone Mode, the amplified speaker assembly according to an embodiment of the present invention will decode a 2-Tone signal for assembly addressability and not for volume control. The 2-Tone signal may be entered as frequency 1 and frequency 2. These frequencies may be between 300 and 1200 Hz and may have significant figures to one tenth of a hertz.
- The default may be programmed to be DTMF Mode.
- Selective Mode Operation may provide, for example, eight input fields. The first field is for Individual paging of the amplified speaker assembly according to an embodiment of the present invention. The individual paging code may be used for individually paging the assembly or adjusting its Output Volume Level. The other seven input fields may be used for various grouping, including "all-paging", of any amplified speaker assembly according to an embodiment of the present invention in the system.
- Each DTMF ID may be similar to the ANI code. The code may be entered as 2 to 8 digits.
- Each 2-tone ID may be similar to Motorola Quick Call II. The 2-Tone signal may be entered as frequency 1 and frequency 2.
- A second field for DTMF, a third field for 2-Tone, may be available for, for example, user friendly descriptions. They may have no significance to the operation of the amplified speaker assembly according to an embodiment of the present invention. These fields may not need to be filled for DTMF or 2-Tone operation.
- The Default for all entries may be programmed to be blank. If all entries are blank, the amplified speaker assembly according to an embodiment of the present invention may be programmed to default to All Call operation and may respond to any Carrier-Detect and Sub-Audible Detect, if applicable, or Page Closure input.
- Audio Mute Timeout may be programmed as a Standby Time to limit the amount of time the audio circuit remains active without having received audio present. At the end of the time out period, the audio circuitry may become muted or deactivated.
- The input range for Standby Time may be 1 to 30 seconds in increments of 1 second. The default may be set to, for example, 4 seconds.
- Volume control which specifies the speaker output level may be programmed to be performed remotely and may require entry of an Individual Page Identification ID.
- The input range for Audio Volume Control may be a scale of 1 to 10 in increments of 1.
- The default may be set to any volume within the input range (10, for example, may represent an 8-Watt output).
- Test-tone duration may be programmed and defines the length of time the test tone lasts during remote level set up. There maybe two inputs available for this section, initial duration and subsequent duration.
- Initial duration of the test tone may define the length of time the first test tone is heard over the loud speaker. The input range for Initial Duration may be 1 to 30 seconds. The default for initial duration may be 5 seconds.
- Subsequent duration of the test tone may define the length of time any following test tone is heard over the loud speaker. The input range for Subsequent Duration may be 1 to 30 seconds. The default for initial duration may be 2 seconds.
- Programming Interface for downloading desired configuration setting to amplified speaker assembly according to an embodiment of the present invention, may by an RS232 Interface.

Exemplary operations of embodiments of an amplified speaker assembly according to the present invention include generic 600-Ohm page port to speaker operation, selective 600-Ohm page port to speaker operation, generic radio to speaker operation and selective radio to speaker operation.

During generic 600-Ohm page port to speaker operation, the amplified speaker assembly is in low power sleep-mode. When the amplified speaker assembly detects Page Closure from the page port, speaker amplifier is activated. At this time, any audio transmitted is heard over the loud speaker while the page closure is activated. After a programmed amount of time, without the Page Closure activation the amplified speaker assembly returns to sleep mode.

During selective 600-ohm page-port to speaker operation, the amplified speaker assembly is in low power sleep-mode. When the amplified speaker assembly detects the Page Closure from the page port, the amplified speaker assembly waits for the correct programmed code to enable the Speaker Amplifier. If the correct code is detected, the amplified speaker assembly determines if it is an audio message or an audio level adjustment command. If it is an audio message, the speaker amplifier is energized and the audio is transmitted to the speaker output. If it is an audio level adjustment command, the speaker amplifier is energized, the digitally controlled variable gain is adjusted to the audio level command setting and a test tone is transmitted to the speaker output. After a programmed amount of time, without the Page Closure activation the amplified speaker assembly returns to sleep mode.

During generic radio to speaker operation, the amplified speaker assembly is in low power sleep-mode. When the amplified speaker assembly detects the Carrier-Detect and Sub-Audible Detect, if applicable, from the RF Receiver, the speaker amplifier is activated. At this time, any audio transmitted is heard over the loud speaker while Carrier-Detect is present and Sub-Audible Detect is present. After a programmed amount of time without the Carrier-Detect and Sub-Audible Detect, if applicable, the amplified speaker assembly returns to sleep mode.

During selective radio to speaker operation, the amplified speaker assembly is in low power sleep-mode, in which the speaker amplifier is not powered. The radio is required to be on at all times. When the amplified speaker assembly receives the Carrier-Detect signal and Sub-Audible Detect, if applicable, from the RF Receiver, the amplified speaker assembly waits for the correct programmed code to enable the speaker amplifier. If the correct code is detected, the amplified speaker assembly determines if it is an audio message or an audio level adjustment command. If it is an audio message, the speaker amplifier is energized and the audio is transmitted to the speaker output. If it is an audio level adjustment command, the speaker amplifier is energized, the digitally controlled variable gain is adjusted to the audio level command setting and a test tone is transmitted to the speaker output. After a programmed amount of time without the Carrier-Detect and Sub-Audible Detect, if applicable, the amplified speaker assembly returns to sleep mode.

Having described an amplified speaker assembly according to exemplary embodiments of the present invention, as well as exemplary operations thereof, the following provides additional detail and/or further description as to the exemplary implementation amplified speaker assemblies according to the present invention.

According to an implementation of an amplified speaker assembly of an embodiment of the present invention, there is provided a capability of accepting a twisted pair, 600-Ohm, 0 dBM audio input from any telephone system page port output (terminal facilities to be provided for field wire connections). There may also be provide an ability to select between a "Hi-Z" (15k Ohms) or "Lo-Z" (600 Ohms) input via an edge card jumper that shall be provided on the PCBA with access through the speaker's front section divider plate. Furthermore, there may be provide a capability of accepting VHF or UHF frequency band audio and replicating via the amplified speaker. The RF module (receiver) and associated antenna may be installed inside the speaker housing. In yet another implementation, there may be provide an ability to recognize the physical/electrical connection between the RF module and the PCBA, automatically converting to radio operating parameters. In yet another implementation, there may be provide the ability to decode a received DTMF string or a 2-Tone signal to be used for the purpose of activating the audio circuit.

According to an implementation of an amplified speaker assembly of an embodiment of the present invention, an amplified speaker assembly may include a weatherproof enclosure housing an 8-Ohm speaker with integral driver.

According to an implementation of an amplified speaker assembly of an embodiment of the present invention, an amplified speaker assembly may be configured to accept a 12VDC input with internally provided termination facilities.

According to an implementation of an amplified speaker assembly of an embodiment of the present invention, an amplified speaker assembly may be configured to recognize the connection of the RF module to automatically switch from 600 ohm to RF mode of operation.

According to an implementation of an amplified speaker assembly of an embodiment of the present invention, an amplified speaker assembly may be configured to switch between "General" and "Select" mode of operation. An edge card dip or slide switch may be provided on the PCBA with access through the speaker's front section divider plate. An assembly may be preset in "General" mode such that the assembly will broadcast any audio present at its input. "Select" mode may be selected to place the speaker into a "programmable" mode of operation. All programming may be done with a Software interface, and all operating parameters may be programmed via the Software interface in this mode of operation.

According to an implementation of an amplified speaker assembly of an embodiment of the present invention, an amplified speaker assembly may be configured to such that a volume control initially be set via a Software interface. A test tone may be broadcasted after entering the volume setting. The default of this test tone may be 3 seconds, with no adjustment necessary. Software interface may provide the ability to select local or DTMF volume control. In "local" mode, the volume control default may be set at maximum, allowing the remotely connected local volume control L-pad to move through the full range of audio level. The assembly may be capable of local volume control even if in "Select" mode of operation.

According to an implementation of an amplified speaker assembly of an embodiment of the present invention, an amplified speaker assembly may be configured such that selecting "DTMF" mode of operation in Software interface will allow the volume to be adjusted in, for example, 10-step increments using DTMF "*" and "#" for up and down control. Upon completion of each up or down volume change, the speaker may broadcast a test tone to give the user an indication of volume level. The default of this test tone may be 3 seconds with no adjustment required. The "Select" mode of operation may require each speaker to be addressed individually via DTMF, followed by the volume command.

According to an implementation of an amplified speaker assembly of an embodiment of the present invention, an amplified speaker assembly may be configured to provide the ability to connect (termination facilities) an optional, external volume control (L-pad) that will operate in conjunction with the existing local volume control. If the external volume control is used, the setting by Software interface may default the volume to a maximum. An external control may provide a minimum/maximum adjustment within that set range.

According to an implementation of an amplified speaker assembly of an embodiment of the present invention, an amplified speaker assembly may be configured such that a software interface may provide an ability to select between "General" or "Select" paging. In the "General" mode, any audio received from the RF module may be broadcasted. In the "Select" mode, a DTMF or 2-Tone access code will be required, even if generating an all-page.

According to an implementation of an amplified speaker assembly of an embodiment of the present invention, an amplified speaker assembly may be configured to be programmed to accept up to eight (8) separate DTMF codes for speaker activation. One code may be used for individual paging, with the remaining codes used for zoning or all-page. The speaker may remain idle until its appropriate DTMF code is received.

According to an implementation of an amplified speaker assembly of an embodiment of the present invention, an amplified speaker assembly may be configured to be programmed to accept up to three (3) separate 2-Tone signals for speaker activation. One signal may be used for individual paging, one for zone paging, and the other may be used for paging all speakers.

According to an implementation of an amplified speaker assembly of an embodiment of the present invention, an amplified speaker assembly may be configured to be capable of trickle-charging an internal battery for power failure backup.

According to an implementation of an amplified speaker assembly of an embodiment of the present invention, an amplified speaker assembly may be configured to have a programming cable connection that is easily accessible for software interface.

According to an implementation of an amplified speaker assembly of an embodiment of the present invention, an amplified speaker assembly may be configured to include: a battery back-up to allow a minimum of, for example, one hour of paging (8-watts) during a power failure; a battery only accessory as a stand-alone, weatherproof power source which may include an 18 amp-hour battery, housed in a weatherproof enclosure with space for mounting an appropriate solar panel charge regulator module; a battery which may include protection circuitry and auto shut-off to avoid battery damage; and a weatherproof volume control assembly for remote volume control.

According to an implementation of an amplified speaker assembly of an embodiment of the present invention, an amplified speaker assembly may be configured to have operating parameters that can be controlled by either switch settings, potentiometer, or via a Software interface. These parameters may include, but are not limited to the following:

General/Select Mode—If General Mode is selected, the speaker may broadcast any audio present at its input. In Select Mode, the audio circuit may be muted until the unit receives the appropriate pre-programmed DTMF code or 2-Tone signal.

Operation Mode—With and RF module connected, all audio to the amplifier circuit may be from the imbedded receiver circuit. With no RF module connected, the circuit may rely on selecting between the "HI-Z" and "LO-Z" switch setting and the audio input will be in the form of a twisted telephone pair signal at a 600 Ohm, 0 dBM signal level.

Select Mode Addressing—If "Select" mode is selected, Software interface may require selection between 2-Tone and DTMF operation. In DTMF operation, Software interface may have provisions of entering up to 8 DTMF codes necessary to un-mute the audio circuit. The first selection may be listed as "Individual" and the remaining 7 codes may be used for zoning and all-call. If 2-Tone is selected, as with the DTMF decode, space may be provided to enter the appropriate code for "Individual", "Zone", or "All" access codes.

Local/DTMF Volume Control—Selection may be provided between the two types of volume control. Local VC selection may allow control from the remote volume control. DTMF VC selection may allow volume control on a pre-determined 10-step scale using the telephone or radio keypad ("*" and "#" for volume up and down). The volume control will be capable of being set via the Software interface.

HI-Z/LO-Z Impedance Select—"LO-Z" select may provide a balanced 600-Ohm input. This may be selected for single speaker connection on a telephone page line or RF operation. "HI-Z" select may provide an unbalanced 15-KOhms input for connecting multiple speakers on a telephone page port output. Default may be LO-Z.

Audio Mute Time Out—The programmable parameter may be used in Radio Mode to limit the amount of time the audio circuit remains active without having received audio present (carrier detect). At the end of the time out period, the audio circuitry may become muted or deactivated.

According to an implementation of an amplified speaker assembly of an embodiment of the present invention, an amplified speaker assembly may be configured to be rated rainproof by a third party laboratory (report on file only, no product marking required). Temperature rating may be −20° C. to +55° C.

Exemplary applications of amplified speaker assemblies according to embodiments of the present invention, include, but are not limited to, the following.

FIG. 2 shows a basic 600 Ohm application diagram which can be used for dial-up paging via a PBX page port output 21 or paging adapter 22 from any telephone 23. It can be configured for one or more amplified speaker assemblies 20 according of the present invention, each programmed for individual, zoned, or system-wide paging. An exemplary application as shown in FIG. 3 would provide the ability to generate a loudspeaker output from each stanchion 24 location when used in conjunction with an emergency telephone 25. A dedicated twisted telephone pair would be required for the speaker, but this should not be a problem because telephone installation criteria usually dictates two or more pairs are run to each telephone extension. It would also require a 12VDC or solar panel power input 26.

FIG. 4 shows, a basic Radio application diagram for paging of amplified speaker assemblies 30 according of the present invention from any handheld 31, mobile, or base radio 32. Uses for this application are temporary public address (carnivals, parades, disaster areas, construction sites, etc.) or permanent installations where cabling was not installed to handle public address requirements (warehouses, golf courses, industrial/commercial facilities, etc.). Overall paging system can be configured for one or more amplified speaker assemblies according of the present invention, each programmed for individual, zoned, or system-wide paging. FIG. 5 shows amplified speaker assembly 40 according of the present invention in combination with an RF Call Box 41 to provide a communication/emergency broadcast solution. The uses for this application would include the need for two-way communications on one RF frequency (public safety, 9$^{th}$ hole food orders, etc.) and area-wide or selective paging on a separate RF frequency (tee-time announcements, emergency/evacuation announcements, etc.). If power is obtained from a solar panel source 42, both units would share the same charge regulator module included in a Solar Panel Kit and installed in the RF Call Box. If more charge time is required, both units may share the battery of the amplified speaker (18 amp-hours).

Numerous additional modifications and variations of the present invention are possible in light of the above teachings. It is therefore to be understood that within the scope of the appended claims, the present invention may be practiced otherwise than as specifically described herein.

I claim:

1. An amplified speaker assembly comprising:
   an audio speaker;
   an amplifier which drives said audio speaker;
   a volume control circuit which controls sound volume output from said audio speaker;
   an input configured to receive an electrical signal; and
   a programmable microprocessor responsive to said signal;
   wherein said programmable microprocessor commands said volume control circuit to adjust said sound volume output from said audio speaker in accordance with said signal,
   wherein said amplifier is activated in reply to a detection of a carrier detect and sub-audible detect in said signal received at said input, whereby an audio signal received at said input is reproduced on said audio speaker.

2. The amplified speaker assembly as claimed in claim 1, wherein said amplifier returns to a stand-by mode after a preprogrammed time period without detection of said carrier detect and said sub-audible detect.

3. The amplified speaker assembly as claimed in claim 1, wherein said amplifier is activated in reply to a detection of a carrier detect and sub-audible detect, and detection of correct programmed code in said signal received at said input.

4. The amplified assembly as claimed in claim 3, wherein said programmable microprocessor is configured to:
   if said signal received at said input comprises an audio signal, reproduce said audio signal received at said input on said audio speaker; or
   if said signal received at said input comprises an audio adjustment level command, command said volume control circuit to adjust said sound volume output from said audio speaker in accordance with said audio adjustment level command.

5. A system comprising a plurality of amplified speaker assemblies as claimed in claim 1.

6. An amplified speaker assembly comprising:
   an audio speaker;
   an amplifier which drives said audio speaker;
   an input configured to receive a signal; and
   a programmable microprocessor responsive to said signal;
   wherein said input comprises a receiver configured for wireless reception of said signal; and
   said microprocessor activates said amplifier in reply to a detection of a carrier detect and sub-audible detect, and detection of correct programmed code in said signal received at said input.

7. The amplified speaker assembly as claimed in claim 6, further comprising a volume control circuit which controls sound volume output from said audio speaker;
   wherein said programmable microprocessor commands said volume control circuit to adjust said sound volume output from said audio speaker in accordance with said signal.

8. The amplified assembly as claimed in claim 7, wherein said programmable microprocessor is configured to:
   if said signal received at said input comprises an audio signal, reproduce said audio signal received at said input on said audio speaker; or
   if said signal received at said input comprises an audio adjustment level command, command said volume control circuit to adjust said sound volume output from said audio speaker in accordance with said audio adjustment level command.

9. A system comprising a plurality of amplified speaker assemblies as claimed in claim 6.

10. A method for addressing an amplified speaker assembly comprising an audio speaker, an amplifier which drives said audio speaker, a volume control circuit which controls sound volume output from said audio speaker, an input configured to receive a signal, and a programmable microprocessor responsive to said signal, said method comprising:
    receiving said signal via a hardwire connection to a source of said signal; and
    adjusting said sound volume output from said audio speaker in accordance with said signal; and
    activating said amplifier in reply to a detection of a page closure in said signal received at said input, whereby an audio signal received at said input is reproduced on said audio speaker.

11. A method for addressing an amplified speaker assembly comprising an audio speaker, an amplifier which drives said audio speaker, a volume control circuit which controls sound volume output from said audio speaker, an input configured to receive a signal, and a programmable microprocessor responsive to said signal, said method comprising:
    receiving said signal via a hardwire connection to a source of said signal; and
    adjusting said sound volume output from said audio speaker in accordance with said signal; and
    activating said amplifier in reply to a detection of a page closure and detection of correct programmed code in said signal received at said input.

12. A method for addressing an amplified speaker assembly comprising an audio speaker, an amplifier which drives said audio speaker, a volume control circuit which controls sound volume output from said audio speaker, an input configured to receive a signal, and a programmable microprocessor responsive to said signal, said method comprising:
    receiving said signal via a hardwire connection to a source of said signal; and
    adjusting said sound volume output from said audio speaker in accordance with said signal; and
    if said signal received at said input comprises an audio signal and correct programmed code, reproducing said audio signal received at said input on said audio speaker, or if said signal received at said input comprises an audio adjustment level command and correct programmed code, performing the adjusting of said sound volume output in accordance with said audio adjustment level command,
    and activating said amplifier in reply to a detection of a carrier detect and sub-audible detect in said signal received at said input, whereby an audio signal received at said input is reproduced on said audio speaker.

13. A method for addressing an amplified speaker assembly comprising an audio speaker, an amplifier which drives said audio speaker, an input configured to receive a signal, and a programmable microprocessor responsive to said signal, said method comprising:

receiving said signal via a wireless connection to a source of said signal; and activating said amplifier in reply to a detection of a carrier detect and sub-audible detect, and detection of correct programmed code in said signal received at said input.

14. The method as claimed in claim 13, wherein the amplified speaker assembly further comprises a volume control circuit which controls sound volume output from said audio speaker, said method further comprising adjusting said sound volume output from said audio speaker in accordance with said signal.

15. The method as claimed in claim 13, further comprising:
if said signal received at said input comprises an audio signal, reproducing said audio signal received at said input on said audio speaker; or
if said signal received at said input comprises an audio adjustment level command, performing the adjusting of said volume output in accordance with said audio adjustment level command.

16. The amplified speaker assembly as claimed in claim 1, wherein said input comprises a receiver configured for wireless reception of said signal.

* * * * *